(12) United States Patent
Kim et al.

(10) Patent No.: US 10,016,724 B2
(45) Date of Patent: Jul. 10, 2018

(54) PURIFICATION METHOD AND PURIFICATION APPARATUS FOR OFF-GAS

(71) Applicant: HANWHA CHEMICAL CORPORATION, Seoul (KR)

(72) Inventors: Sang ah Kim, Incheon (KR); Jea Sung Park, Daejeon (KR); Won Ik Lee, Bucheon-si (KR); Gil Ho Kim, Daejeon (KR); Bo Kyung Kim, Daejeon (KR); Gui Ryong Ahn, Daejeon (KR)

(73) Assignee: HANWHA CHEMICAL CORPORATION, Seoul (KR)

( * ) Notice: Subject to any disclaimer, the term of this patent is extended or adjusted under 35 U.S.C. 154(b) by 0 days.

(21) Appl. No.: 15/113,110

(22) PCT Filed: Jan. 19, 2015

(86) PCT No.: PCT/KR2015/000525
§ 371 (c)(1),
(2) Date: Jul. 21, 2016

(87) PCT Pub. No.: WO2015/111886
PCT Pub. Date: Jul. 30, 2015

(65) Prior Publication Data
US 2017/0007962 A1 Jan. 12, 2017

(30) Foreign Application Priority Data

Jan. 24, 2014 (KR) .................. 10-2014-0009101
Jan. 24, 2014 (KR) .................. 10-2014-0009102
Apr. 29, 2014 (KR) .................. 10-2014-0051668

(51) Int. Cl.
*B01D 53/86* (2006.01)
*C01B 3/50* (2006.01)
(Continued)

(52) U.S. Cl.
CPC ............ *B01D 53/8659* (2013.01); *C01B 3/50* (2013.01); *C23C 16/24* (2013.01);
(Continued)

(58) Field of Classification Search
CPC ........ B01D 53/8659; B01D 2257/2045; B01D 2258/0216; C01B 3/50; C01B 2203/0465; C23C 16/24; C23C 16/4412
See application file for complete search history.

(56) References Cited

U.S. PATENT DOCUMENTS 5,118,485 A * 6/1992 Arvidson .......... C01B 33/10773
423/342
5,401,872 A 3/1995 Burgie
(Continued)

FOREIGN PATENT DOCUMENTS

CN 102264642 11/2011
CN 103058140 4/2013
(Continued)

OTHER PUBLICATIONS

PCT Search Report & Written Opinion, Patent Cooperation Treaty, dated May 4, 2015, Application No. PCT/KR2015/000525.

*Primary Examiner* — Daniel C McCracken
(74) *Attorney, Agent, or Firm* — Lex IP Meister, PLLC

(57) ABSTRACT

The present invention relates to a purification method and a purification apparatus for off-gas. More specifically, the present invention relates to a purification method and a purification apparatus for off-gas, capable of lowering the concentration of hydrogen chloride and separating high-purity hydrogen from the off-gas, which is discharged after performing a polysilicon deposition process by a chemical vapor deposition reaction.

11 Claims, 11 Drawing Sheets

(51) Int. Cl.
  *C23C 16/24* (2006.01)
  *C23C 16/44* (2006.01)
(52) U.S. Cl.
  CPC .. *C23C 16/4412* (2013.01); *B01D 2257/2045* (2013.01); *B01D 2258/0216* (2013.01); *C01B 2203/0465* (2013.01)

(56) References Cited

U.S. PATENT DOCUMENTS

| 9,221,689 | B2 | 12/2015 | Mueh |
| 2009/0098039 | A1 | 4/2009 | Wakamatsu et al. |
| 2012/0198998 | A1 | 8/2012 | Kurosawa |
| 2016/0166986 | A1 | 6/2016 | Kim et al. |

FOREIGN PATENT DOCUMENTS

| CN | 103180246 | 6/2013 |
| JP | 59-33328 | 2/1984 |
| JP | 07-315829 | 12/1995 |
| JP | 09-038463 | 2/1997 |
| JP | 11-070319 | 3/1999 |
| JP | 2001-059677 | 3/2001 |
| JP | 2001-293332 | 10/2001 |
| JP | 2006-131491 | 5/2006 |
| JP | 2006-290674 | 10/2006 |
| JP | 2010-248067 | 11/2010 |
| JP | 2011-084422 | 4/2011 |
| JP | 2012-532083 | 12/2012 |
| JP | 2013-540095 | 10/2013 |
| KR | 10-2010-0080902 | 7/2010 |
| KR | 10-2011-0127097 | 11/2011 |
| KR | 10-2013-0005223 | 1/2013 |
| KR | 10-1325796 | 10/2013 |
| KR | 10-2013-0124323 | 11/2013 |
| KR | 10-2013-0138357 | 12/2013 |
| KR | 10-2014-0005229 | 1/2014 |
| WO | 2013-163614 | 10/2013 |
| WO | 2015-006173 | 1/2015 |

* cited by examiner

PURIFICATION METHOD AND PURIFICATION APPARATUS FOR OFF-GAS

BACKGROUND OF THE INVENTION (a) Field of the Invention

The present invention relates to a purification method and a purification apparatus for off-gas. More specifically, the present invention relates to a purification method and a purification apparatus for off-gas, capable of lowering the concentration of hydrogen chloride and separating high-purity hydrogen from the off-gas, which is discharged after performing a polysilicon deposition process by a chemical vapor deposition reaction.

This application claims priority to Korean Patent Application No. 10-2014-0009101 filed on Jan. 24, 2014, Korean Patent Application No. 10-2014-0009102 filed on Jan. 24, 2014, and Korean Patent Application No. 10-2014-0051668 filed on Apr. 29, 2014 with the Korean Intellectual Property Office, the contents of which are herein incorporated by reference in their entirety.

(b) Description of the Related Art

One of the known methods for producing polysilicon for solar cells is based on the lamination of polysilicon in a chemical vapor deposition (CVD) reactor, which is also known as Siemens process.

Silicon filaments typically used in the Siemens process is exposed to trichlorosilane with carrier gas at a high temperature of more than 1000° C.

Trichlorosilane gas decomposes and deposits silicon on a heated silicon filament phase, growing the heated silicon filament as shown in Reaction Equation 1 below.

$$2HSiCl_3 \rightarrow Si + 2HCl + SiCl_4 \quad \text{[Reaction Equation 1]}$$

After performing the deposition process of polysilicon by the chemical vapor deposition as described above, chlorosilane-based compounds such as dichlorosilane, trichlorosilane or silicon tetrachloride, or hydrogen and hydrogen chloride are discharged as a reaction by-product.

Off-gas (OGR) containing these chlorosilane-based compounds, hydrogen and hydrogen chloride is generally recovered and recycled through four stages of 1) condensation and compression process, 2) absorption and distillation of hydrogen chloride (HCl), 3) adsorption process of hydrogen ($H_2$), 4) separation process of chlorosilane-based compounds.

More specifically, the off-gas discharged from the polysilicon deposition reactor is transferred to a condensation and compression process, cooled and flowed into a knock-out drum. Separation by temperature is performed, a condensed phase stream of chlorosilane-based compounds is transferred to a distillation column of hydrogen chloride (HCl), and a non-condensed phase stream is transferred to a bottom of the absorption column of hydrogen chloride. At this time, the composition of hydrogen ($H_2$) in the non-condensed phase stream is about 90 mol % or more.

The condensed phase stream where hydrogen chloride component is removed from the hydrogen chloride distillation column is mixed while spraying at the top of an absorption column, and the chlorosilane-based compound component and hydrogen chloride in the non-condensed phase streams are absorbed and removed.

Gas stream where most of the chlorosilane-based compound component and hydrogen chloride has been removed is flowed into a column filled with an activated carbon. The residual chlorosilane-based compound component and hydrogen chloride are absorbed, thus recovering high-purity hydrogen.

Hydrogen purification method described above is a pressure swing adsorption (PSA) process, which is adopted for the separation purification of polysilicon off-gas.

FIG. 1 illustrates a purification apparatus for off-gas according to a prior art.

Referring to FIG. 1, the purification apparatus 300 for off-gas according to the prior art includes a knock-out drum 315, an absorption column 325, a first distillation column 345, an adsorption column 355 and a second distillation column 360.

The off-gas 301 discharged from a polysilicon deposition reactor 305 is cooled in a first cooler 310, flowed into a knock-out drum 315 and divided into a non-condensed gas phase stream 302 containing hydrogen in an excessive amount and a condensed liquid phase stream 303 containing a chlorosilane-based compound in an excessive amount. At this time, most of hydrogen chloride contained in off-gas 301 is distributed in a non-condensed phase stream 302.

The non-condensed gas phase stream 302 discharged from the top of the knock-out drum 315 is additionally cooled and pressurized in a second cooler 320 and then injected into an absorption column 325. At this time, most of hydrogen chloride and chlorosilane components contained in the non-condensed phase stream 302 are removed by a chlorosilane-based stream 307 sprayed in a first distillation column 345 which will be described below. On the other hand, hydrogen stream 304 discharged from the top of the absorption column 325 is finally purified and recycled in the adsorption column 355.

The liquid phase stream 303 discharged from the bottom of the knock-out drum 315 is mixed with a stream 306 discharged from the absorption column 325 via a pump 350 and then injected into a first distillation column 345. A gaseous hydrogen chloride is separated and discharged at the top of the first distillation column 345, and a chlorosilane-based stream 307 where hydrogen chloride has been removed is discharged at the bottom. At this time, the process of the first distillation column 345 consumes more than about 40% of energy of the overall purification process, and is operated with a high-energy process where the most energy is consumed. Most of chlorosilane-based streams 307 are again transferred to the absorption column 325 via a pump 335 and a cooler 330, and used for the absorption of hydrogen chloride and chlorosilane in the non-condensed phase stream 302. The remainder is transferred to a second distillation column 360 and separated into di-/trichlorksilane and silicon tetrachloride, and then recycled.

In the conventional purification method as described above, in order to remove hydrogen chloride contained in the non-condensed stream 302, the condensed phase stream 307 where hydrogen chloride component has been removed from the first distillation column 345 is sprayed and supplied to the absorption column 325. For this process, it is necessary to cool at the absorption column 325 and heat at the first distillation column 345. Thus, there is a problem that the use of energy is inefficient. In addition, in order to ensure the purity of the non-condensed phase, the condensed phase stream from the top of the absorption column 325 is excessively recycled, and thus a major cause is an increase in energy costs for the off-gas purification process.

SUMMARY OF THE INVENTION

For resolving the aforesaid problems of the prior arts, it is an object of the present invention to provide a purification method and a purification apparatus for off-gas, capable of effectively removing hydrogen chloride gas with a high energy efficiency from the off-gas generated during a polysilicon deposition process by a chemical vapor deposition (CVD) reaction.

To achieve the above object, the present invention provides a purification method for off-gas which comprises the steps of:

passing the off-gas, which is discharged after performing a polysilicon deposition process by a chemical vapor deposition (CVD) reaction, through a catalytic reactor containing an ion exchange resin catalyst, to lower the concentration of hydrogen chloride; and passing the off-gas through the catalytic reactor and then separating hydrogen and chlorosilane-based compounds contained in the passed off-gas.

Also, the present invention provides a purification apparatus for off-gas which comprises:

a catalytic reactor that contains an ion exchange resin catalyst, and lowers the concentration of hydrogen chloride by passing the off-gas, which is discharged after performing a polysilicon deposition process by a chemical vapor deposition (CVD) reaction; and a separation device that separates hydrogen and chlorosilane-based compounds from the off-gas passed through the catalytic reactor.

Further, the present invention provides a purification method for off-gas which comprises the steps of:

separating the off-gas, which is discharged after performing a polysilicon deposition process by a chemical vapor deposition (CVD) reaction, into a non-condensed phase stream and a condensed phase stream; and passing the condensed phase stream through a catalytic reactor containing an ion exchange resin catalyst to lower the concentration of hydrogen chloride.

Further, the present invention provides a purification apparatus for off-gas which comprises:

a separation device that separates the off-gas, which is discharged after performing a polysilicon deposition process by a chemical vapor deposition (CVD) reaction, into a non-condensed phase stream and a condensed phase stream; and a catalytic reactor that contains an ion exchange resin catalyst, and lowers the concentration of hydrogen chloride from the condensed phase stream.

Further, the present invention provides a purification method for off-gas which comprises the steps of:

separating the off-gas, which is discharged after performing a polysilicon deposition process by a chemical vapor deposition (CVD) reaction, into a non-condensed phase stream and a condensed phase stream;

passing the non-condensed phase stream through a first catalytic reactor to lower the concentration of hydrogen chloride; and separating chlorosilane-based compounds of the condensed phase stream according to the boiling point.

According to the purification method and the purification apparatus for off-gas of the present invention, instead of performing the condensation and compression process and performing the separation by the boiling point difference in order to remove hydrogen chloride from the off-gas discharged from the polysilicon deposition reactor, hydrogen chloride is removed by converting it into chlorosilane-based compounds using a catalytic reactor. Thereby, some problems that can be caused by hydrogen chloride, for example, corrosion, leakage of chlorosilane, deterioration of separation membrane, elution phenomenon of impurities contained in an activated carbon, and the like can be reduced, and high-purity hydrogen where hydrogen chloride has been removed can be prepared and recycled.

Furthermore, the purification method and the purification apparatus for off-gas of the present invention are relatively simple, and may be implemented by low-energy devices, thus reducing the operation costs of the equipment and process.

In addition, according to the purification method for off-gas of the present invention, an absorption column for removing hydrogen chloride is not necessary and thus, the operation can be made by lowering the pressure of the step of compressing the non-condensed phase discharged after the first condensation and separation step than a conventional pressure range, thereby further improving the effects for reducing energy consumption.

DETAILED DESCRIPTION OF THE EMBODIMENTS

Figure 1:
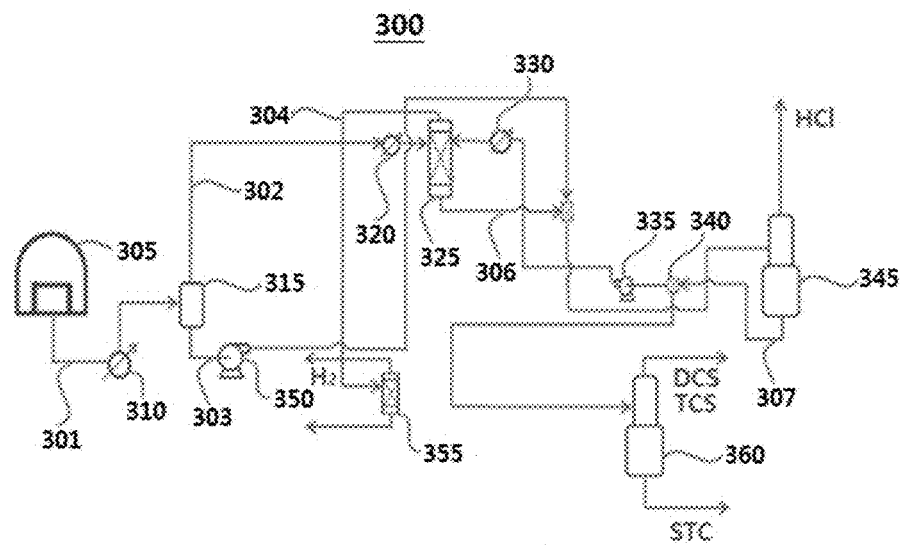
FIG. 1 illustrates a purification apparatus for off-gas of the prior art.

In the present disclosure, the terms "the first", "the second", etc. are used to describe various elements, and these terms are used only for the purpose of distinguishing one element from another element.

The terms as used in this disclosure are to describe exemplary embodiments only and they are not intended to limit the present invention. The expression for singular shall include the plural meaning unless otherwise interpreted clearly in the context. The terms "comprise", "include" or "have" as used in this disclosure are to define the existence of the features, integers, steps, constituent elements, or their combination, and it shall be understood not to exclude the existence and the additional possibilities of one or more other features, integers, steps, constituent elements or their combination.

Further, it means that, when each layer or element is referred to as being formed "on" or "top" of the respective layers or elements, each layer or element is formed on the top of the respective layers or elements, or the other layer or element may be additionally formed between the respective layers, or on the object or the substrate.

While the present invention is susceptible to various modifications and alternative forms, specific embodiments will be illustrated and described in detail as follows. It should be understood, however, that the description is not intended to limit the present invention to the particular forms disclosed herein, but the intention is to cover all modifications, equivalents, and replacements falling within the spirit and scope of the invention.

Hereinafter, the purification method and the purification apparatus for off-gas of the present invention will be described in more detail.

According to an embodiment of the present invention, there is provided a purification method for off-gas which comprises the steps of: passing the off-gas, which is discharged after performing a polysilicon deposition process by a chemical vapor deposition (CVD) reaction, through a catalytic reactor containing an ion exchange resin catalyst to lower the concentration of hydrogen chloride; and passing the off-gas through the catalytic reactor and then separating hydrogen and chlorosilane-based compounds contained in the passed off-gas.

First, throughout the present disclosure, the term "off-gas" refers to a gas which is discharged after performing a polysilicon deposition process, especially a polysilicon deposition process by a chemical vapor deposition (CVD) reaction, and may include a variety of compounds, but it may be a gas including hydrogen chloride (HCl), hydrogen ($H_2$) and a chlorosilane-based compound.

In addition, the off-gas includes all of a non-condensed gas state, a condensed liquid state or a mixed state thereof, and it may include not only a gas discharged immediately after performing a polysilicon deposition process but also a gas having a different composition from a gas discharged immediately after performing a polysilicon deposition process, through the other process.

Further, throughout the present disclosure, the term "condensed phase steam" refers to a stream where off-gas flows in a liquid state through processes such as cooling, pressurization, separation and purification, and includes all of a stream formed by one step, or a stream formed by multi-step processes of two or more steps or a mixed stream thereof. In addition, the condensed phase stream can be used interchangeably with a liquid phase stream. On the other hand, as the condensed phase stream is mixed with a stream derived from one or more processes, it can be a state where a part of gas (for example, about 10% by weight or less) is mixed. The case where a part of gas is mixed as described above is included in the condensed phase stream of the present invention.

Further, throughout the present disclosure, the term "non-condensed phase steam" refers to a steam where off-gas flows in a gas state through heating, depressurization, separation, purification and the like, and includes all of a stream formed by one step, or a stream formed by multi-step processes of two or more steps or a mixed stream thereof. In addition, the non-condensed phase stream can be used interchangeably with a gas phase stream. On the other hand, the non-condensed phase stream may be mixed with a stream derived from one or more processes, or it may be a state where a part of liquid (for example, about 15% by weight or less) is mixed by condensation by heat exchange. Further, the case where a part of liquid is mixed as described above is included in the condensed phase stream of the present invention.

As one of the known methods for producing polysilicon, a chemical vapor deposition (CVD) reaction refers to a method for depositing silicon on a silicon filament by heating the silicon filament, injecting a gaseous silicon precursor compound such as trichlorosilane and then performing thermal decomposition.

As a by-product of the polysilicon deposition process by a chemical vapor deposition reaction, the off-gas including chlorosilane-based compounds such as dichlorosilane ($SiH_2Cl_2$), trichlorosilane ($SiHCl_3$) and silicon tetrachloride ($SiCl_4$) as well as hydrogen chloride (HCl), hydrogen ($H_2$) and the like is generated.

Hydrogen and chlorosilane-based compounds can be separated from various components contained in such off-gas and recycled back to the chemical vapor deposition. However, among the components contained in the off-gas, hydrogen chloride is difficult to recycle and can cause corrosion of the device and thus, it is desirable to remove hydrogen chloride after the process. However, it is not easy to remove hydrogen chloride due to low boiling point and molecular weight.

In the conventional purification method for off-gas, the off-gas discharged from the polysilicon deposition reactor is transferred to the compression and condensation process and subjected to separation by temperature. Accordingly, the condensed phase stream containing chlorosilane-based compounds is transferred to a distillation column to separate hydrogen chloride at the top, and the non-condensed phase stream is transferred to the bottom of the absorption column.

The condensed phase streams where hydrogen chloride (HCl) component has been removed from the distillation column are mixed with spraying at the top of the absorption column, to absorb and remove the chlorosilane-based component and hydrogen chloride (HCl) in the non-condensed phase stream.

Subsequently, hydrogen streams where most of chlorosilane components and hydrogen chloride have been removed are flowed into a column filled with an activated carbon, and the residual hydrogen chloride and chlorosilane-based compounds are absorbed by the activated carbon, thereby recovering high-purity hydrogen.

In the conventional purification method for off-gas as described above, in order to remove hydrogen chloride contained in the non-condensed phase stream, the condensed phase stream where hydrogen chloride component has been removed from the distillation column is sprayed and supplied to the absorption column. For this process, it is necessary to cool at the absorption column and heat at the distillation column. Thus, there is a problem that the use of energy is inefficient. In addition, in order to ensure the purity of the non-condensed phase, the condensed stream is excessively recycled to the absorption column, and thus a major cause is an increase in energy costs for the off-gas purification process.

However, the purification method for off-gas of the present invention is relatively simple as compared to a conventional process, and may be implemented by low-energy devices, thus reducing the operation costs of the equipment and process.

In the purification method for off-gas according to an embodiment of the present invention, hydrogen chloride can be converted into trichlorosilane and/or silicon tetrachloride by passing the off-gas through a catalytic reactor, rather than separating hydrogen chloride into a gas phase by the boiling point difference in the distillation column, thereby reducing the discharge of hydrogen chloride.

That is, according to the purification method according to an embodiment of the present invention, a catalytic reactor containing an ion exchange resin catalyst is prepared, and the off-gas, which is discharged after performing a polysilicon deposition process by a chemical vapor deposition (CVD) reaction, is passed through the catalytic reactor to lower the concentration of hydrogen chloride contained in the off-gas.

As the above-described ion exchange resin catalyst, a cyclic amine compound, a styrene-based polymer containing an amine group, a styrene-divinyl benzene-based polymer containing an amine group, an acrylic polymer containing an amine group, or mixtures thereof can be used. Examples of the cyclic amine compound may include vinylpyridine, pyridazine, pyrimidine, pyazine, piperidine, pyrrolidine and the like, but the invention are not limited thereto.

The amine groups are not particularly limited, but tertiary or quaternary amine groups may be preferred in terms of the efficiency of the ion exchange resin. In addition, styrene-based or styrene-divinylbenzene-based polymers may be prepared by methods conventionally known, but are not particularly limited thereto. For example, as an example of the method for preparing the catalyst, a phthalimide process may be used. In this case, a divinylbenzene-crosslinked polystyrene resin is reacted with phthalimide or phthalimide derivatives. The hydrolysis product of the primary polyvinyl benzylamine thus obtained is reacted with formaldehyde and formic acid. Thereby, a polystyrene resin having a tertiary amino group can be obtained.

In addition, the ion exchange resin catalyst is commercially readily available, for example, the type of the acrylic polymers may include the product names of Amberlite IRA-958, Amberlite IRA-67 or the like, and the type of the styrene-based or styrene-divinylbenzene-based polymer may include the product names of Amberlyst® A-21, Dowex M-43, LEWATIT® MP 62 WS or the like. The cyclic amine compound may include the product names of Reillex®HP, Reillex®425 or the like.

According to an embodiment of the present invention, the catalytic reactor may include an amine-based compound. Examples of the amine-based compound may include an amine, an ammonium salt, an aminosilane, an aminosiloxane, an aminoalkoxysilane or the like, but the invention is not limited thereto.

According to the purification method of the present invention, hydrogen chloride contained in the off-gas is converted into trichlorosilane ($SiHCl_3$) and/or silicon tetrachloride ($SiCl_4$) while passing through the ion exchange resin catalyst in accordance with the reaction formulas 1 and/or 2 below. Further, by using the above-described ion exchange resin catalyst, the effects of removing impurities contained in the off-gas can be provided.

    [Reaction Formula 1]

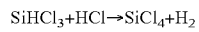    [Reaction Formula 2]

As described above, as the off-gas containing hydrogen chloride, hydrogen and chlorosilane-based compounds passes through the ion exchange resin catalyst, hydrogen chloride can be converted into trichlorosilane and/or silicon tetrachloride in accordance with the reaction formulas 1 and/or 2.

More specifically, the above-described reaction can be performed by the following mechanism. First, the hydrogen chloride molecule forms an amine-hydrochloride or an amine-chlorosilane salt by the amine functional groups of the ion exchange resin catalyst. Further, Cl⁻ ions of amine-hydrochloride can attack silicon atoms of trichlorosilane by an acid-catalytic reaction, thereby falling hydrogen atom and forming silicon tetrachloride.

According to the present invention, the composition ratio of the respective components contained in the off-gas is not particularly limited. In the case of the off-gas which is discharged after performing a polysilicon deposition process by a chemical vapor deposition reaction, hydrogen accounts for more than about 50 mol % relative to the entire off-gas, and the remainder may be hydrogen chloride and chlorosilane-based compounds. In addition, the molar ratio of hydrogen ($H_2$) and hydrogen chloride (HCl) may be about 99:1. On the other hand, for more effective removal of hydrogen chloride, the number of moles of trichlorosilane can be included in an amount of 1 mole or more relative to 1 mole of hydrogen chloride (HCl).

The content of hydrogen chloride occupied in the entire off-gas may be reduced to about 80 mol % or more, for example, about 80 to about 100 mol %, preferably about 90 to 99.9 mol %, with respect to the content before passing through the catalytic reactor.

The step of passing the off-gas through the catalytic reactor containing the ion exchange resin catalyst may be performed at a temperature of about −40 to about 200° C., preferably about −20 to about 150° C. and more preferably about 0 to about 100° C. under a pressure of about 1 to about 30 bar, preferably about 1 to about 20 bar and more preferably about 1 to about 10 bar, but are not limited thereto. Within a range where the ion exchange resin catalyst is activated, the conditions can be appropriately changed.

After passing the off-gas through the catalytic reactor containing the ion exchange resin catalyst, a separation process for separating hydrogen and chlorosilane-based compounds contained in the passed off-gas is performed.

The separation process can be used without particular limitation if it is a method for separating high-boiling point compounds and low boiling point compounds from the mixture, and for example, it can be performed by a distillation process, a separation membrane process, a gas-liquid separation process, or a combination thereof.

More specifically, according to one embodiment of the present invention, first, the off-gas passed through the catalytic reactor is flowed into the first distillation column. Hydrogen is discharged at the top of the first distillation column and the chlorosilane-based compound is discharged at the bottom thereof. The chlorosilane-based compound discharged from the bottom is flowed into the second distillation column. Dichlorosilane and trichlorosilane can be discharged at the top of the second distillation column and silicon tetrachloride can be separated at the bottom of the second distillation column. Among the separated components, the components except for silicon tetrachloride can be recycled to the feeding process for performing the polysilicon deposition process.

According to another embodiment of the present invention, the off-gas passed through the catalytic reactor is subjected to a primary cooling and flowed into a knock-out drum, and then separated into a condensed phase and a non-condensed phase. Among the components separated from the knock-out drum, the non-condensed phase contained in excess hydrogen is purified by the separation membrane, and the purified hydrogen can be recycled for the polysilicon deposition process. The condensed phase stream containing the chlorosilane-based compounds which did not pass through the separation membrane, can be flowed into the distillation column and separated into gas phase dichlorosilane and trichlorosilane, and liquid phase silicon tetrachloride. Among the separated components, the components except for silicon tetrachloride is recycled to the feeding process for performing the polysilicon deposition process.

According to another embodiment of the present invention, there is provided a purification apparatus for off-gas which comprises: a catalytic reactor that contains an ion exchange resin catalyst and lowers the concentration of hydrogen chloride by passing the off-gas discharged after performing a polysilicon deposition process by a chemical vapor deposition (CVD) reaction; and a separation device that separates hydrogen and a chlorosilane-based compound from the off-gas passed through the catalytic reactor.

In this regard, the description of the catalytic reactor containing an ion exchange resin catalyst and the off-gas is the same as described above in the purification method.

The separation device can be used without particular limitation if it is a common device which can separate high boiling point compounds and low boiling point compounds from the mixture. For example, the separation device may include a distillation device, a separation membrane device, a knock-out drum, a gas-liquid separation device or the like. In addition, the separation device may be installed in the rear end of the catalytic reactor, and it can be operated under different devices and operating conditions, depending on the object to be separated.

Hereinafter, the purification device according to an embodiment of the present invention will be described in more detail with reference to the accompanying drawings.

Figure 2:
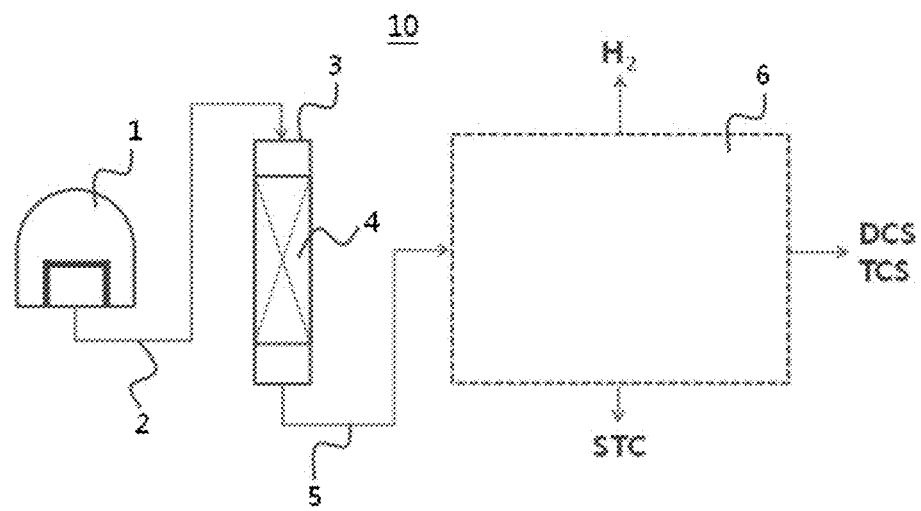
FIG. 2 illustrates a purification apparatus for off-gas in accordance with an embodiment of the present invention.

FIG. 2 illustrates a purification apparatus for off-gas in accordance with an embodiment of the present invention.

Referring to FIG. 2, the purification device 10 according to an embodiment of the present invention includes a catalytic reactor 3 and a distillation column 6.

In the catalytic reactor 3, the off-gas, which is discharged from the polysilicon deposition reactor 1, is transferred for the separation and purification. At this time, the off-gas 2 may contain more than about 50 mol % of hydrogen, about 0.01 to about 5 mol % of hydrogen chloride, about 0.01 to about 10 mol % of dichlorosilane, about 0.01 to about 25 mol % of trichlorosilane, and about 0.01 to about 10 mol % of silicon tetrachloride, but are not limited thereto.

A catalytic reactor 3 is filled with an ion exchange resin catalyst 4.

The off-gas 2 passes through a catalytic reactor 3 filled with an ion exchange resin catalyst 4, and in the catalytic reactor 3, hydrogen chloride can be converted into trichlorosilane and/or silicon tetrachloride according to the reaction formulas 1 and/or 2 described above. The catalytic reactor 3 can be operated under temperature conditions of about −40 to about 200° C., preferably about −20 to about 150° C. and more preferably about 0 to about 100° C., but are not limited thereto, which can be changed within the range where an ion exchange resin catalyst 4 is not deactivated.

In addition, the operating pressure is in the range of about 1 to about 30 bar, preferably about 1 to about 20 bar and more preferably about 1 to about 10 bar, but it can be changed within the range that does not affect the activity of the ion exchange resin catalyst 4 and the operation of the catalytic reactor 3.

The mixed gas 5 passed through the catalytic reactor 3 is transferred to the distillation column 6 connected with the rear end of the catalytic reactor 3 for the separation and purification. In this case, the mixed gas passed through the catalytic reactor 3 may include more than about 50 mol % of hydrogen, about 0.01 to about 5 mol % of dichlorosilane, about 0.01 to about 25 mol % of trichlorosilane and about 0.01 to about 30 mol % of silicon tetrachloride.

In the distillation column 6, the mixed gas 5 can be separated into hydrogen, dichlorosilane and trichlorosilane-mixed gas, and liquid silicon tetrachloride, and recycled to the polysilicon deposition reactor 1 for recycling.

Figure 3:
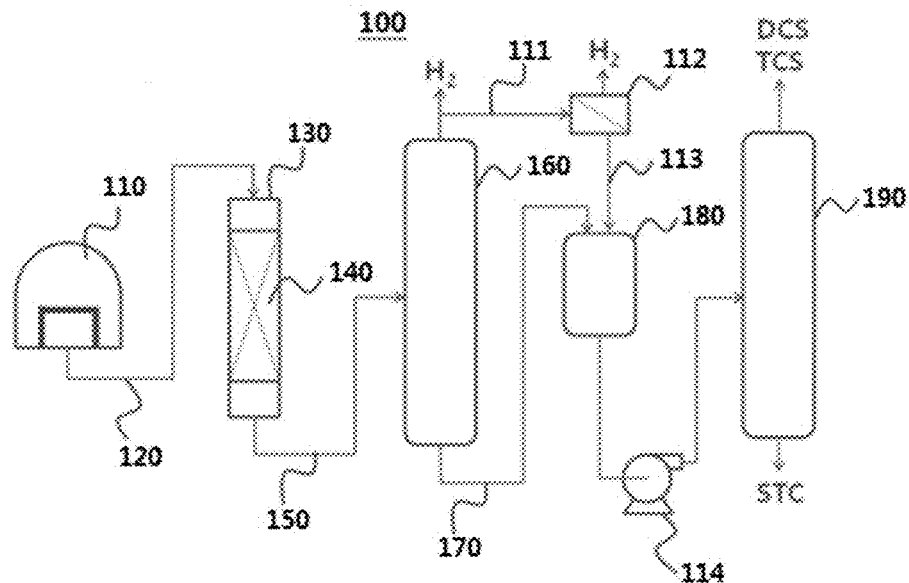
FIG. 3 illustrates a purification apparatus for off-gas in accordance with an embodiment of the present invention.

FIG. 3 illustrates a purification apparatus for off-gas in accordance with an embodiment of the present invention.

Referring to FIG. 3, the purification apparatus 100 for off-gas according to an embodiment of the present invention includes a catalytic reactor 130, a first distillation column 160, and a second distillation column 190.

In the catalytic reactor 130, the off-gas, which is discharged from the polysilicon deposition reactor 110, is transferred for the separation and purification. At this time, the off-gas 120 may include more than about 50 mol % of hydrogen, about 0.01 to about 5 mol % of hydrogen chloride, about 0.01 to about 10 mol % of dichlorosilane, about 0.01 to about 25 mol % of trichlorosilane and about 0.01 to about 10 mol % of silicon tetrachloride, but are not limited thereto.

The catalytic reactor 130 is filled with an ion exchange resin catalyst 140.

The off-gas 120 passes through the catalytic reactor 130 filled with an ion exchange resin catalyst 140, and in the catalytic reactor 130, hydrogen chloride can be converted into trichlorosilane and/or silicon tetrachloride according to the reaction formulas 1 and/or 2 described above. The catalytic reactor 130 can be operated under temperature conditions of about −40 to about 200° C., preferably about −20 to about 150° C., and more preferably about 0 to about 100° C., but are not limited thereto, which can be changed within the range where an ion exchange resin catalyst 140 is not deactivated.

In addition, the operating pressure is in the range of about 1 to about 30 bar, preferably about 1 to about 20 bar and more preferably about 1 to about 10 bar, but it can be changed within the range that does not affect the activity of the ion exchange resin catalyst 140 and the operation of the catalytic reactor 130.

The mixed gas 150 passed through the catalytic reactor 130 is flowed into the first distillation column 160. Hydrogen 111 is separated at the top of the first distillation column 160, and chlorosilane-based compound 170 is discharged at the bottom. At this time, the first distillation column 160 may be operated at a low temperature below the boiling point of dichlorosilane to separate hydrogen 111 and chlorosilane-based compound 170. In addition, in order to increase the separation efficiency, a cooler is further installed before the first distillation column 160 to lower the temperature of the mixed gas 150. The chlorosilane-based compound 170 discharged from the bottom of the first distillation column 160 may contain about 5 to about mol % of dichlorosilane, about 40 to about 60 mol % of trichlorosilane and about 30 to about 50 mol % of silicon tetrachloride.

Chlorosilane-based compound 170 is transferred to a storage tank 180. The chlorosilane-based compound discharged from the storage tank 180 is transferred to the second distillation column 190 via a pump 114. Dichlorosilane and trichlorosilane are discharged in a gas state from the top of the second distillation column 190, and silicon tetrachloride is discharged in a liquid state from the bottom. At this time, the second distillation column 190 can be operated between the dew point of silicon tetrachloride and the boiling point of trichlorosilane. The operating pressure of the first distillation column 160 and the second distillation column 190 may be about 0 to about 10 bar, and the boiling point and the dew point of the respective components are determined by the vapor pressure and the operating pressure.

On the other hand, in order to increase the purity of hydrogen which is discharged from the first distillation column 160, it is possible to install a separation membrane 112, and the flowed hydrogen stream 111 may be in whole or in part. Further, impurities 113 separated from the separation membrane 112 are flowed into a storage tank 180, and mixed with the chlorosilane-based compound 170 discharged from the first distillation column 160, and then transferred from the second distillation column 190.

Figure 4:
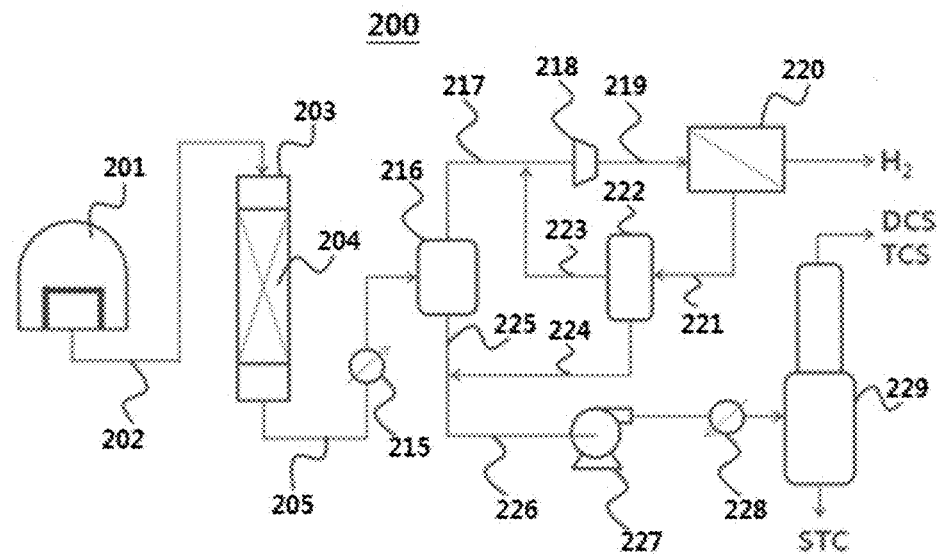
FIG. 4 illustrates a purification apparatus for off-gas in accordance with an embodiment of the present invention.

FIG. 4 illustrates a purification apparatus for off-gas in accordance with an embodiment of the present invention.

Referring to FIG. 4, the purification apparatus 200 for off-gas in accordance with an embodiment of the present invention includes a catalytic reactor 203, a knock-out drum 216, a separation membrane 220, and a distillation column 229.

In the catalytic reactor 203, the off-gas 202, which is discharged from the polysilicon deposition reactor 201, is transferred for the separation and purification. At this time, the off-gas 202 may include more than about 50 mol % of hydrogen, about 0.01 to about 5 mol % of hydrogen chloride, about 0.01 to about 10 mol % of dichlorosilane, about 0.01 to about 25 mol % of trichlorosilane and about 0.01 to about 10 mol % of silicon tetrachloride, but are not limited thereto.

The catalytic reactor 203 is filled with an ion exchange resin catalyst 204.

The off-gas 202 is passed through the catalytic reactor 203 filled with an ion exchange resin catalyst 204, and within the catalytic reactor 203, hydrogen chloride can be converted into trichlorosilane and/or silicon tetrachloride according to the reaction formulas 1 and/or 2 described above. The catalytic reactor 203 can be operated under temperature conditions of about −40 to about 200° C., preferably about −20 to about 150° C., and more preferably about 0 to about 100° C., but are not limited thereto, which can be changed within the range where an ion exchange resin catalyst 204 is not deactivated.

In addition, the operating pressure is in the range of about 1 to about 30 bar, preferably about 1 to about 20 bar and more preferably about 1 to about 10 bar, but it can be changed within the range that does not affect the activity of the ion exchange resin catalyst 204 and the operation of the catalytic reactor 203.

The mixed gas 205 passed through the catalytic reactor 203 is cooled to below −5° C. through a cooler 215 and then flowed into a knock-out drum 216. At this time, in order to facilitate the transport of the mixed gas 205, a pump is installed at the rear end of the cooler 215 or the position of the knock-out drum 216 is placed at the bottom of the catalyst reactor 203, thereby allowing the flowing due to gravity.

The mixed gas stream from the knock-out drum 216 is separated into a non-condensed phase stream 217 containing hydrogen in an excessive amount and a condensed phase stream 225 containing chlorosilane-based compounds in an excessive amount by the vapor pressure of the respective components. The non-condensed phase stream 217 may include more than about 80 mol % of hydrogen, and the composition of the chlorosilane-based compound within the non-condensed phase stream 217 may be determined according to the temperature and pressure of the knock-out drum 216. The non-condensed phase stream 217 is compressed by using a compressor 218 to pass through the separation membrane 220, and for example, it can be pressurized at about 3 to about 6 bar or more. The pressurized non-condensed phase stream 219 is separated into high-purity hydrogen that has passed through the separation membrane 220 and impurities 221 that have not passed through the separation membrane 220. Impermeable impurities 221 discharged from the separation membrane 220 are passed through a liquid separator 222 and again separated into a hydrogen stream 223 and a chlorosilane-based condensed phase stream 224, wherein the hydrogen stream 223 is mixed with the non-condensed phase stream 217 discharged from the top of the knock-out drum 216 and passed through the compressor 218.

The condensed-phase stream 225 discharged from the bottom of the knock-out drum 216 is mixed with the chlorosilane-based condensed phase stream 224 discharged from the liquid separator 222 to form a chlorosilane-based stream 226. The chlorosilane-based stream 226 is transferred to a distillation column 229 via a pump 227. At this time, in order to improve the separation efficiency before being introduced into the distillation column 229, a heater 228 may be further included. The chlorosilane-based stream 226 can be heated to about 30 to about 70° C. by a heater 228.

The chlorosilane-based stream 226 flowed into the distillation column 229 is separated into gas phase dichlorosilane and trichlorosilane and liquid phase silicon tetrachloride and then discharged. At this time, the distillation column 229 can be operated within the pressure range of about 3 to about 7 bar and between the dew point of silicon tetrachloride and the boiling point of trichlorosilane. The dew point of silicon tetrachloride and the boiling point of trichlorosilane are determined by the operating pressure and the vapor pressure of the respective components.

According to the purification method and the purification apparatus for off-gas of the present invention as described above, instead of performing the condensation and compression process and performing the separation by the boiling point difference in order to remove hydrogen chloride from the off-gas discharged from the polysilicon deposition reactor, hydrogen chloride is removed by converting it into a chlorosilane-based compound using a catalytic reactor. Thereby, the energy consumption can be reduced to 40% or more, as compared to a conventional off-gas purification process using the absorption column.

Therefore, hydrogen chloride is not discharged to the outside, and it is possible to prevent a number of problems that can be caused by hydrogen chloride. Moreover, to remove hydrogen chloride having a low boiling point, the non-condensed phase stream containing hydrogen chloride is cooled and compressed, and then again sprayed and supplied to the absorption column, as in the conventional purification method. Thus, the inefficiencies of energy use can be avoided and it is possible to effectively remove hydrogen chloride with a low energy process.

According to another embodiment of the present invention, there is provided a purification method for off-gas which comprises the steps of: separating the off-gas, which is discharged after performing a polysilicon deposition process by a chemical vapor deposition (CVD) reaction, into a non-condensed phase stream and a condensed phase stream; and passing the condensed phase stream through a catalytic reactor containing an ion exchange resin catalyst to lower the concentration of hydrogen chloride.

According to an embodiment of the present invention, first, the off-gas, which is discharged after performing a polysilicon deposition process, is separated into a non-condensed gas phase stream and a condensed liquid phase stream.

More specifically, according to an embodiment of the present invention, the off-gas discharged from a chemical vapor deposition reactor is cooled, and then flowed into a knock-out drum, and separated into a non-condensed gas phase stream containing hydrogen in an excessive amount and a condensed liquid phase stream containing chlorosilane-based compounds in an excessive amount.

The non-condensed gas phase stream separated from the top of the knock-out drum is injected into the absorption column after additional cooling and pressurization. Hydrogen contained in the non-condensed phase stream can be discharged at the top of the absorption column, and finally purified in the absorption column and recycled. In addition, hydrogen chloride contained in the non-condensed phase stream is discharged to the bottom of the absorption column and finally removed through a catalytic reactor that will be described below.

The condensed liquid phase stream separated from the bottom of the knock-out drum is injected into the catalytic reactor containing an ion exchange resin catalyst. Alternatively, the condensed phase stream separated at the bottom of the knock-out drum can be injected into the catalytic reactor containing the ion exchange resin catalyst, by passing the non-condensed phase stream separated at the top of the knock-out drum through the absorption column and then mixing with the liquid phase stream discharged from the absorption column.

According to an embodiment of the present invention, the off-gas, which is discharged from a chemical vapor deposition reactor, is flowed into the knockout drum after the first cooling, and then separated into a non-condensed gas phase stream containing hydrogen in an excessive amount and a condensed liquid phase stream containing chlorosilane-based compounds in an excessive amount.

The non-condensed gas phase stream discharged from the top of the knockout drum is flowed into a condenser and subjected to a second cooling at a low temperature. Due to the second low-temperature cooling, additional condensation of hydrogen chloride and chlorosilane that are contained in the non-condensed gas phase stream is generated, and the condensed stream is recycled back to the knock-out drum. Then, the non-condensed stream is injected into the absorption column, and hydrogen contained in the non-condensed phase stream can be discharged at the top of the absorption column and finally purified at the adsorption column and recycled. In addition, hydrogen chloride contained in the non-condensed phase stream is discharged to the bottom of the absorption column, and finally removed through a catalytic reactor that will be described below.

The liquid-condensed phase stream discharged from the bottom of the knock-out drum is injected into a catalytic reactor containing an ion exchange resin catalyst. Alternatively, it can be mixed with a liquid phase stream discharged from the absorption column and injected into a catalytic reactor containing an ion exchange resin catalyst.

By passing the condensed liquid phase stream through the catalytic reactor containing the ion exchange resin catalyst, the hydrogen chloride contained in the liquid-condensed phase stream is removed.

As the ion exchange resin catalyst, a cyclic amine compound, a styrene-based polymer containing an amine group, a styrene-divinyl benzene based polymer containing an amine group, an acrylic polymer containing an amine group, or mixtures thereof can be used. Examples of the cyclic amine compound may include vinylpridine, pyridazine, pyrimidine, pyrazine, piperidine, pyrrolidine and the like, but the invention is not limited thereto.

A more detailed description of the ion exchange resin catalyst, and specific types, mechanism and effects thereof are the same as previously described.

The composition ratio of the respective components contained in the condensed phase stream is not particularly limited, but according to an embodiment of the present invention, the condensed phase stream injected into the catalytic reactor may contain about 0.01 to about 5 mol % of hydrogen chloride, about 0.01 to about 1 mol % of hydrogen, and a residual amount of the chlorosilane-based compound. On the other hand, for more effective removal of hydrogen chloride, the number of moles of trichlorosilane can be included in an amount of more than 1 mole based on 1 mole of hydrogen chloride (HCl).

The relative content of hydrogen chloride occupied in the entire condensed phase stream may be reduced to about 80 mol % or more, for example, about 80 to about 100 mol %, preferably about 90 to 99.9 mol %, with respect to the content before passing through the catalytic reactor.

The step of passing the condensed phase stream through the catalytic reactor containing the ion exchange resin catalyst may be performed at a temperature of about −40 to about 200° C., preferably about −20 to about 150° C. and more preferably about 0 to about 100° C. under a pressure of about 1 to about 30 bar, about 1 to about 20 bar and more preferably about 1 to about 10 bar, but are not limited thereto. Within the range where the ion exchange resin catalyst is activated, the conditions can be appropriately changed.

According to an embodiment of the present invention, after passing the condensed phase stream through the catalytic reactor containing the ion exchange resin catalyst, a separation process for separating chlorosilane-based compounds contained in the passed condensed phase stream can be performed.

The separation process can be used without particular limitation if it is a method for separating high-boiling point compounds and low boiling point compounds from the mixture. For example, it can be performed by a distillation process, a separation membrane process, a gas-liquid separation process, or a combination thereof.

According to another embodiment of the present invention, there is provided a purification apparatus for off-gas which comprises: a separation device that separates the off-gas, which is discharged after performing a polysilicon deposition process by a chemical vapor deposition (CVD) reaction, into a non-condensed phase stream and a condensed phase stream; and a catalytic reactor that contains an ion exchange resin catalyst, and lowers the concentration of hydrogen chloride from the condensed phase stream.

In this regard, the description of the catalytic reactor containing the ion exchange resin catalyst and the off-gas is the same as described above in the above purification method.

The separation device can be used without particular limitation if it is a common device which can separate high boiling point compounds and low boiling point compounds from the mixture. For example, the separation device may include a knock-out drum, a distillation device, a separation membrane device, a gas-liquid separation device or the like. In addition, the separation device may be installed in the front end of the catalytic reactor, and it can be operated under different devices and operating conditions from each other, depending on the object to be separated.

More specifically, according to an embodiment of the present invention, the off-gas discharged from the chemical vapor deposition reactor is flowed into the knock-out drum after cooling, and separated into a non-condensed gas phase stream containing hydrogen in an excessive amount and a condensed liquid phase stream containing chlorosilane-based compounds in an excessive amount.

The non-condensed gas phase stream discharged from the top of the knock-out drum is injected into the absorption column after additional cooling and pressurization. Hydrogen contained in the non-condensed phase stream is discharged at the top of the absorption column and finally purified in the absorption column and recycled. In addition, hydrogen chloride contained in the non-condensed phase stream is discharged to the bottom of the absorption column and finally removed through a catalytic reactor that will be described below.

The condensed liquid phase stream discharged from the bottom of the knock-out drum is mixed with the liquid phase stream discharged from the absorption column and then injected into the catalytic reactor containing the ion exchange resin catalyst. In the catalytic reactor containing the ion exchange resin catalyst, hydrogen chloride is converted into trichlorosilane($SiHCl_3$) and/or silicon tetrachloride ($SiCl_4$) by the reaction shown in the reaction formulas 1 and/or 2 to lower the concentration of hydrogen chloride. Thus, the chlorosilane-based stream having lowered concentration of hydrogen chloride is discharged.

According to another embodiment of the present invention, the off-gas discharged from the chemical vapor deposition reactor is flowed into the knock-out drum after cooling, and separated into a non-condensed gas phase stream containing hydrogen in an excessive amount and a condensed liquid phase stream containing chlorosilane-based compounds in an excessive amount.

The non-condensed gas phase stream discharged from the top of the knock-out drum is flowed into a condenser and cooled at a low temperature. Due to the low-temperature cooling, additional condensation of hydrogen chloride and chlorosilane that are contained in the non-condensed gas phase stream is generated, and the condensed stream is recycled back to the knock-out drum. Then, the non-condensed phase stream can be injected into the absorption column, and hydrogen contained in the non-condensed phase stream can be discharged from the top of the absorption column, and finally purified in the adsorption column and recycled. In addition, hydrogen chloride contained in the non-condensed phase stream is discharged to the bottom of the absorption column and finally removed through the catalytic reactor.

The condensed liquid phase stream discharged from the bottom of the knock-out drum is mixed with the liquid phase stream discharged from the absorption column and then injected into the catalytic reactor containing an ion exchange resin catalyst. In the catalytic reactor containing the ion exchange resin catalyst, the concentration of hydrogen chloride is lowered by the reaction of the reaction formulas 1 and/or 2, thereby discharging a chlorosilane-based stream having lowered concentration of hydrogen chloride. At this time, due to the low-temperature cooling of the stream discharged from the top of the knock-out drum, the amount of hydrogen chloride and chlorosilane is reduced in the non-condensed phase stream. Therefore, the recycling stream of liquid phase chlorosilane to be flowed into the absorption column can be considerably reduced and operated. The remainder is transferred to the second distillation column, separated into di-/trichlorosilane and silicon tetrachloride and then recycled.

Hereinafter, the purification apparatus according to an embodiment of the present invention will be described in more detail with reference to the accompanying drawings.

Figure 5:
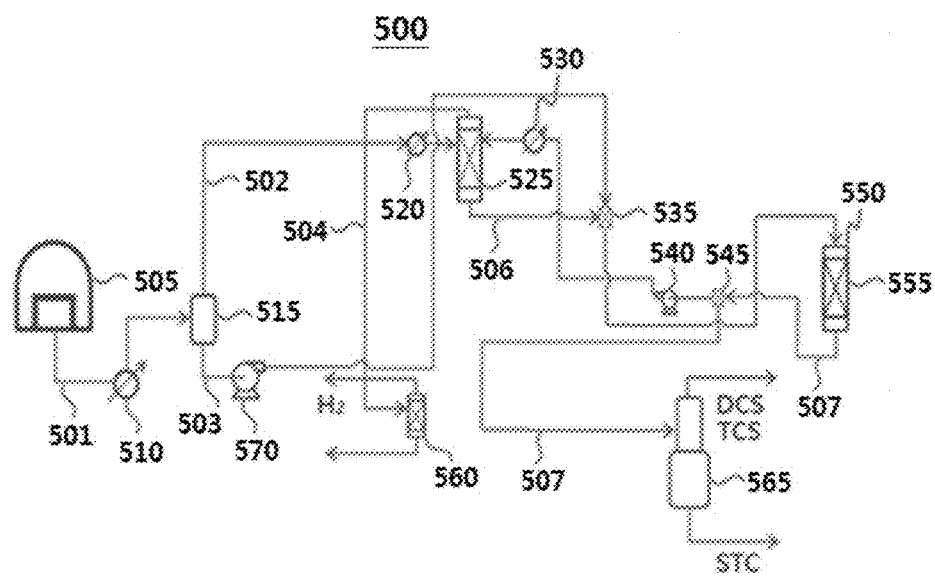
FIG. 5 illustrates a purification apparatus for off-gas in accordance with an embodiment of the present invention.

FIG. 5 illustrates a purification apparatus for off-gas in accordance with an embodiment of the present invention.

Referring to FIG. 5, the purification apparatus 500 for off-gas according to an embodiment of the present invention includes a catalytic reactor 550, a knock-out drum 515, an absorption column 525, an adsorption column 560 and a distillation column 565.

The off-gas 501 discharged from the polysilicon deposition reactor 505 is cooled in a first cooler 510, then flowed into the knock-out drum 515, and separated into a non-condensed phase stream 502 containing hydrogen in an excessive amount and a condensed phase stream 503 containing chlorosilane-based compounds in an excessive amount. The non-condensed phase stream 502 may include more than about 80 mol % of hydrogen, and the composition of the chlorosilane-based compounds in the non-condensed phase stream 502 may be determined depending on the temperature and pressure of the knock-out drum 515.

The non-condensed phase stream 502 discharged from the top of the knock-out drum 515 is injected into an absorption column 525 after additional cooling and pressurization. At this time, hydrogen contained in the non-condensed phase stream 502 is discharged at the top of the absorption column 525, and finally purified in the absorption column 560 and recycled. In addition, hydrogen chloride contained in the non-condensed phase stream 502 is discharged to the bottom of the absorption column 525 and then finally removed through the catalytic reactor 550, as described below.

The condensed phase stream 503 discharged from the bottom of the knock-out drum 515 is mixed with a liquid phase stream 506 discharged from the bottom of the absorption column 525 via a pump 570, and injected into a catalytic reactor 550. At this time, a mixed stream of the condensed phase stream 503 and the liquid phase stream 506 may include about 0.01 to 1 mol % of hydrogen, about 0.01 to about 5 mol % of hydrogen chloride, about 0.01 to about 10 mol % of dichlorosilane and about 0.01 to about 80 mol % of trichlorosilane, and about 0.01 to about 50 mol % of silicon tetrachloride, but are not limited thereto.

The mixed stream of the condensed phase stream 503 and the liquid phase stream 506 is passed through the catalytic reactor 550 filled with the ion exchange resin catalyst 555, and in the catalyst reactor 550, hydrogen chloride can be converted into trichlorosilane and/or silicon tetrachloride according to the above-described reaction formulas 1 and 2.

The catalytic reactor 550 can be operated under temperature conditions of about −40 to about 200° C., preferably from about −20 to about 150° C. and more preferably about 0 to about 100° C., but are not limited thereto, which can be changed within the range where the ion exchange resin catalyst 555 is not deactivated.

In addition, the operating pressure is in the range of about 1 to about 30 bar, preferably about 1 to about 20 bar and more preferably about 1 to about 10 bar, but it can be changed within the range that does not affect the activity of the ion exchange resin catalyst 555 and the operation of the catalytic reactor 550.

Unlike a conventional purification process including a distillation column instead of a catalytic reactor 550, the above step converts hydrogen chloride into chlorosilane-based compounds, and thus a gaseous hydrogen chloride is not discharged.

A part of the liquid phase chlorosilane-based stream 507 discharged from the bottom of the catalytic reactor 550 is transferred to an absorption column 525 via a cooler 530, and used to absorb hydrogen chloride and chlorosilane-based compounds in the non-condensed phase stream 502, and the remainder is transferred to a distillation column 565. The chlorosilane-based stream 507 flowed into the distillation column 565 is separated into gas phase dichlorosilane and trichlorosilane and liquid phase silicon tetrachloride and then discharged. At this time, the distillation column 556 can be operated within the pressure range of about 3 to about 7 bar and between the dew point of silicon tetrachloride and the boiling point of trichlorosilane. The dew point of silicon tetrachloride and the boiling point of trichlorosilane are determined by the operating pressure and the vapor pressure of the respective components.

Figure 6:
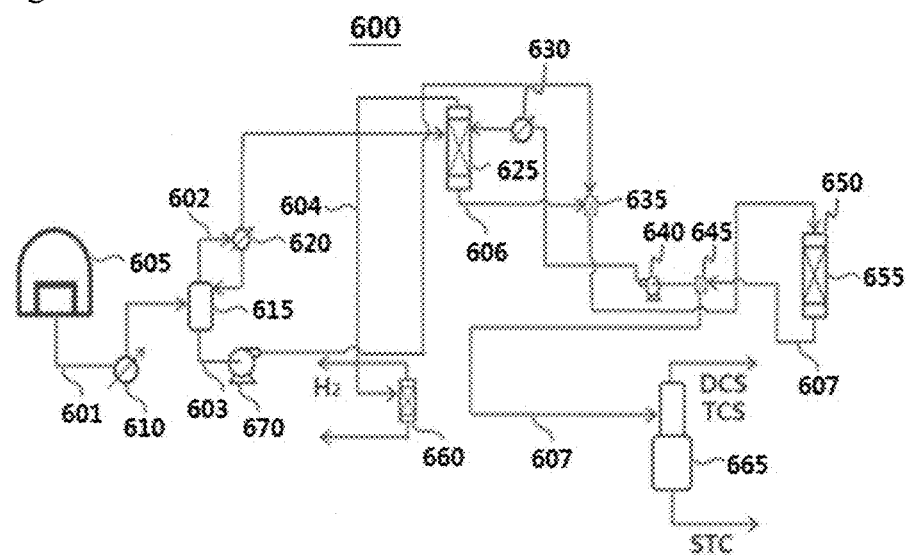
FIG. 6 illustrates a purification apparatus for off-gas in accordance with an embodiment of the present invention.

FIG. 6 illustrates a purification apparatus for off-gas in accordance with an embodiment of the present invention.

Referring to FIG. 6, the purification apparatus 600 for off-gas according to an embodiment of the present invention includes a catalytic reactor 650, a knock-out drum 615, an absorption column 625, an adsorption column 660 and a distillation column 665.

The off-gas 601 discharged from the polysilicon deposition reactor is cooled in a first cooler 610, and then flowed into a knock-out drum 615, and separated into a non-condensed phase stream 602 containing hydrogen in an excessive amount and a condensed phase stream 603 containing chlorosilane-based compounds in an excessive amount. The non-condensed phase stream 602 may include more than about 80 mol % of hydrogen, and the composition of the chlorosilane-based compounds in the non-condensed phase stream 602 may be determined depending on the temperature and pressure of the knock-out drum 615.

The non-condensed phase stream 602 discharged from the top of the knock-out drum 615 is flowed into a second cooler 620 and cooled to a low temperature. At this time, the cooler can be operated at a temperature ranging from about −30 to about −70° C., and more preferably from about −40 to about −60° C. Due to the low-temperature cooling, additional condensation of hydrogen chloride and chlorosilane contained within the non-condensed phase stream 602 is generated, and the condensed liquid stream is recycled back to the knock-out drum 615. Then, hydrogen chloride contained in the non-condensed phase stream 602 injected from the absorption column 625 is discharged to the bottom of the absorption column 625 and finally removed via the absorption column 650 which will be described below. Hydrogen stream 604 discharged from the top of the absorption column 625 is finally purified in the absorption column 660 and recycled.

The condensed phase stream 603 discharged from the bottom of the knock-out drum 615 is mixed with a liquid phase stream 606 discharged from the bottom of the absorption column 625 via a pump 670 and injected into a catalytic reactor 650. At this time, the mixed steam of the condensed phase stream 603 and the liquid stream 606 may contain about 0.01 to 1 mol % of hydrogen, about 0.01 to about 5 mol % of hydrogen chloride, about 0.01 to about 10 mol % of dichlorosilane, about 0.01 to about 80 mol % of trichlorosilane, and about 0.01 to about 50 mol % of silicon tetrachloride, but are not limited thereto.

The mixed stream of the condensed phase stream 603 and the liquid phase stream 606 passes through the catalytic reactor 650 filled with the ion exchange resin catalyst 655, and in the catalyst reactor 650, hydrogen chloride can be converted into trichlorosilane and/or silicon tetrachloride according to the above-described reaction formulas 1 and/or 2. The catalytic reactor 650 can be operated under temperature conditions of about −40 to about 200° C., preferably about −20 to about 150° C. and more preferably about 0 to about 100° C., but are not limited thereto, which can be changed within a range where the ion exchange resin catalyst 655 is not deactivated.

In addition, the operating pressure is in the range of about 1 to about 30 bar, preferably about 1 to about 20 bar and more preferably about 1 to about 10 bar, but it can be changed within the range that does not affect the activity of the ion exchange resin catalyst 655 and the operation of the catalytic reactor 650.

Unlike a conventional purification process including a distillation column instead of a catalytic reactor 650, the above step converts hydrogen chloride into chlorosilane-based compound, and thus a gaseous hydrogen chloride is not discharged.

A part of the liquid phase chlorosilane-based stream 607 discharged from the bottom of the catalytic reactor 650 is transferred to an absorption column 625 and used to absorb hydrogen chloride and chlorosilane-based compounds in the non-condensed phase stream. At this time, the non-condensed phase stream 602 discharged from the top of the knock-out drum 615 is in a state where the amount of hydrogen chloride and the chlorosilane-based compounds is significantly reduced by additional low-temperature cooling due to a second cooler 620. Therefore, the liquid phase chlorosilane-based recycled stream to be transported to the absorption column 625 can be operated to reduce to the range of about 30 to 90%, and more preferably to the range of about 50 to 80%.

The residual stream is transferred to a distillation column 665. The chlorosilane-based stream 607 flowed into the distillation column 665 is separated into gas phase dichlorosilane and trichlorosilane and liquid phase silicon tetrachloride and then discharged. At this time, the distillation column 665 can be operated within the pressure range of about 3 to about 7 bar and between the dew point of silicon tetrachloride and the boiling point of trichlorosilane. The dew point of silicon tetrachloride and the boiling point of trichlorosilane are determined by the operating pressure and the vapor pressure of the respective components.

According to another embodiment of the present invention, there is provided a purification method for off-gas which comprises the steps of:

separating the off-gas, which is discharged after performing a polysilicon deposition process by a chemical vapor deposition (CVD) reaction, into a non-condensed phase stream and a condensed phase stream;

passing the non-condensed phase stream through a first catalytic reactor to lower the concentration of hydrogen chloride; and separating a chlorosilane-based compound of the condensed phase stream according to the boiling point.

In the purification method according to another embodiment of the present invention, first, the off-gas, which is discharged after performing a polysilicon deposition process is condensed to separate into a non-condensed gas phase stream and a condensed liquid phase stream (first condensation and separation step). At this time, the non-condensed phase stream can include hydrogen in an excessive amount, and the condensed phase stream can include a chlorosilane-based compound in an excessive amount. In addition, hydrogen chloride may be relatively more distributed in the non-condensed phase stream than the condensed phase stream.

The first condensation may be performed at a temperature of greater than about −30° C. and less than about 10° C., preferably greater than about −20° C. and less than about 5° C., more preferably greater than about −10° C. and less than about 0° C. When the condensation is performed within the above temperature range, it can effectively separate into a stream containing hydrogen in an excessive amount and a stream containing a chlorosilane-based compound in an excessive amount. When the condensation is performed at a temperature of −30° C. or less, the composition of dichlorosilane and trichlorosilane is relatively lowered and thus effective removal of hydrogen chloride becomes difficult. Further, when the condensation is performed at a temperature of greater than 10° C., the content of the chlorosilane-based compound contained in the non-condensed phase stream increases and the processing costs associated with this increase, which is undesirable.

The non-condensed gas phase stream is injected into a first catalytic reactor, and in the first catalytic reactor, hydrogen chloride can be converted into chlorosilane-based compound (catalytic reaction step).

The non-condensed gas phase stream may, before being injected into the first catalytic reactor, further undergo a step of performing pressurization in order to increase the reduced pressure in the first condensation step at a suitable level to flow into the first catalytic reactor (compression step). According to one embodiment of the present invention, the non-condensed gas phase stream can be pressurized so that it becomes a pressure of about 1 to about 50 bar, preferably a pressure of about 1 to 40 bar, and more preferably a pressure of about 1 to about 30 bar.

According to an embodiment of the present invention, the first catalytic reactor may include an ion exchange resin catalyst.

As the ion exchange resin catalyst, a cyclic amine compound, a styrene-based polymer containing an amine group, a styrene-divinyl benzene-based polymer containing an amine group, an acrylic polymer containing an amine group, or mixtures thereof can be used. Examples of the cyclic amine compound may include vinyl pyridine, pyridazine, pyrimidine, pyrazine, piperidine, pyrrolidine and the like, but the invention is not limited thereto A more detailed description of the ion exchange resin catalyst, the specific types, mechanism, and effects thereof are the same as previously described.

According to one embodiment of the present invention, the first catalytic reactor may include an amine-based compound. Examples of the amine-based compound may include amine, ammonium salt, amino silane, aminosiloxane, aminoalkoxy silane or the like, but the invention is not limited thereto.

According to another embodiment of the present invention, the first catalytic reactor may include a transition metal catalyst. Examples of the transition metal catalyst may include platinum, palladium, ruthenium, nickel, iridium, rhodium or the like, and metal oxides, metal hydrides, organometallic compounds, complex metal oxides can be also included, but the present invention is not limited thereto. According to one embodiment of the present invention, the transition metal catalyst may be preferably palladium (Pd) or platinum (Pt).

Further, the amine-based compound or the transition metal catalyst may be preferably in a state of being coupled or supported to a support. In addition, the support is not particularly limited as long as it can be generally used as a support of an amine-based compound or a transition metal. Preferably, it can be a carbon support such as an activated carbon, a carbon nanotube, a carbon nanoribbon, a carbon nanowire, a porous carbon, a carbon powder, or a carbon black, and an inorganic support such as silica ($SiO_2$), or alumina ($Al_2O_3$).

According to a further embodiment of the present invention, the first catalytic reactor may include an activated carbon as a catalyst.

In the non-condensed phase stream passed through the first catalytic reactor, hydrogen chloride is converted into a chlorosilane-based compound and thus, the concentration of hydrogen chloride may be significantly reduced by about 80 mol % or more, for example, about 80 to about 100 mol %, and preferably about 90 to about 99.9 mol %, as compared with the concentration before passing through the first catalytic reactor.

Thus, the non-condensed phase stream having lowered concentration of hydrogen chloride is subjected to the second condensation and separated into a hydrogen stream and a chlorosilane-based stream (second condensation and separation step). The hydrogen stream separated by the second condensation can be sent to the adsorption process, finally purified and recycled (adsorption step). The chlorosilane-based stream separated after the second condensation can be again injected into the first condensation and separation step and recycled.

On the other hand, the condensed-phase stream discharged from the first condensation and separation step can be transferred to the distillation step and separated into di-/trichlorsilane and silicon tetrachloride and recycled (distillation step).

According to one embodiment of the present invention, prior to undergoing the distillation step, a step for distilling hydrogen chloride to remove a small amount of hydrogen chloride contained in the condensed phase stream can be further performed. However, separately, a step of passing through the catalyst reactor can be further performed.

Further, according to one embodiment of the present invention, the chlorosilane-based stream separated after the second condensation can be joined with the condensed phase stream discharged in the first condensation and separation step or individually injected into the distillation step.

As described above, before separating the condensed-phase stream discharged from the first condensation and separation step into di-/trichokwosilane and silicon tetrachloride, a distillation step or a second catalytic reaction step is further performed, thereby further lowering the content of hydrogen chloride in the overall cycling stream.

The second catalytic reactor used to remove hydrogen chloride of the condensed-phase stream may include a catalyst such as an ion exchange resin, an amine-based compound or a transition metal, which is the same or different from the first catalytic reactor. The first and second catalytic reactors can be operated under individual conditions.

The purification method for off-gas according to an embodiment of the present invention will be described in more detail with reference to the accompanying drawings.

Figure 7:
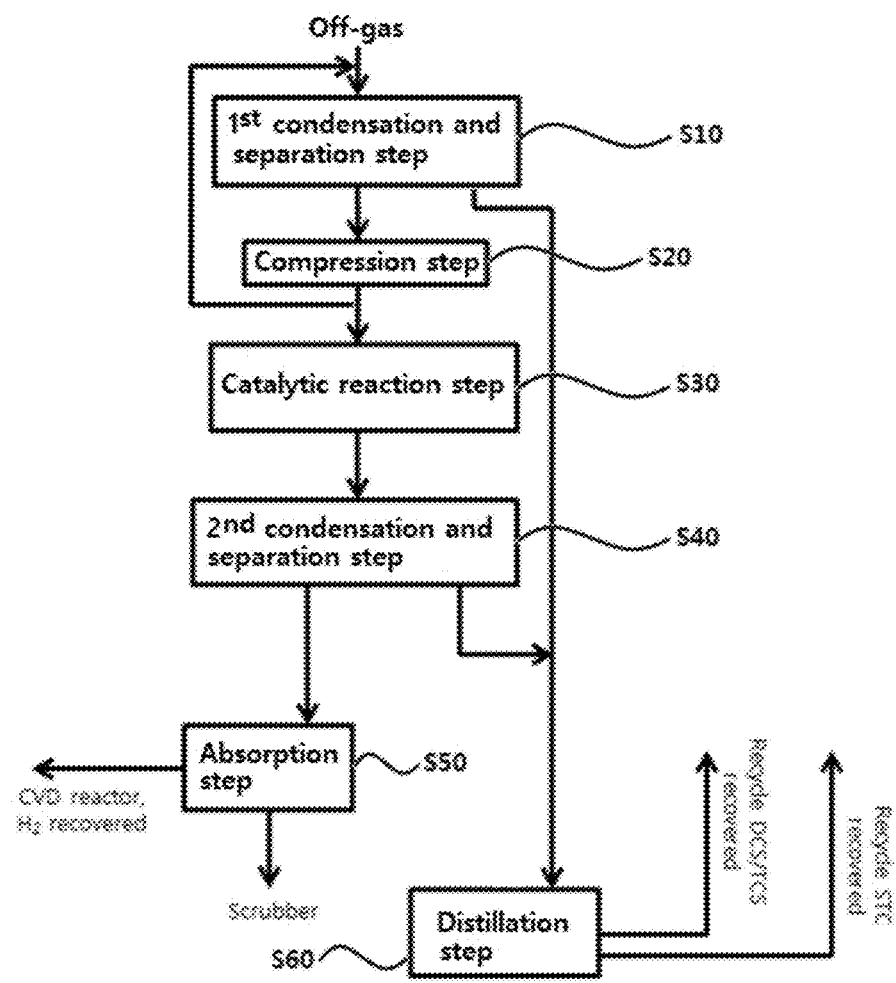
FIG. 7 illustrates a flow diagram of a purification method for off-gas in accordance with an embodiment of the present invention.
Figure 8:
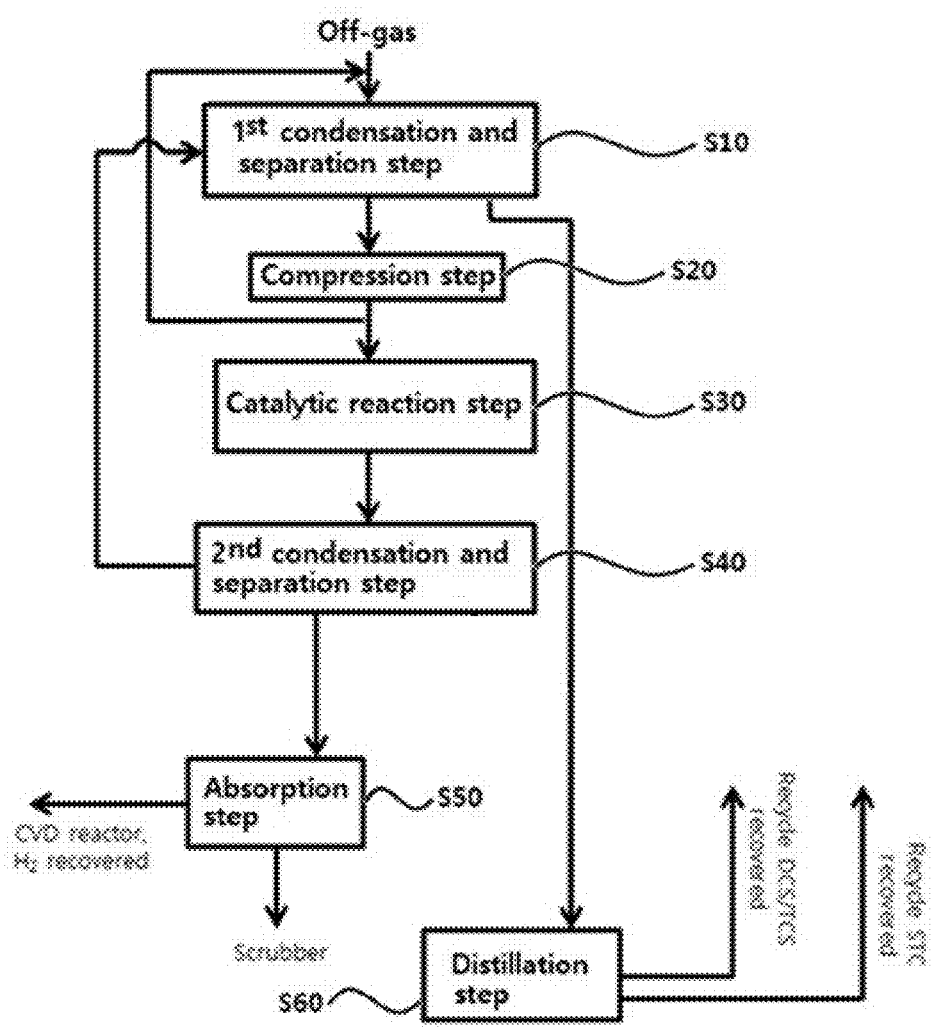
FIG. 8 illustrates a flow diagram of a purification method for off-gas in accordance with an embodiment of the present invention.

FIGS. 7 and 8 illustrate a flow diagram of a purification method for off-gas in accordance with an embodiment of the present invention.

Referring to FIGS. 7 and 8, the purification method for off-gas according to an embodiment of the present invention includes a first condensation and separation step (S10), a compression step (S20), a catalytic reaction step (S30), a second condensation and separation step (S40), an adsorption step (S50), and a distillation step (S60).

First, referring to FIG. 7, the off-gas discharged from the chemical vapor deposition reactor is separated into a non-condensed gas phase stream containing hydrogen in an excessive amount and a condensed liquid phase stream containing chlorosilane-based compounds in an excessive amount in the first condensation and separation step (S10).

The non-condensed gas phase stream discharged from the first condensation and separation (S10) is injected into a catalytic reaction step (S30) after a compression step (S20). At this time, hydrogen chloride contained in the non-condensed phase stream is converted into trichlorosilane and silicon tetrachloride in the catalytic reaction step (S30), thereby lowering the concentration of hydrogen chloride.

The non-condensed phase stream passed through the catalytic reaction step (S30) is sent to the second condensation and separation step (S40). Hydrogen discharged from the second condensation and separation (S40) can be finally purified in the adsorption step (S50) and recycled. In addition, the condensed liquid phase stream having lowered concentration of hydrogen chloride, which is discharged from the second condensation and separation step (S40), can be joined with the condensed phase steam discharged from the first distillation step (S10) and injected into the distillation step (S60).

The stream sent to the distillation step (S60) can be separated into di-/trichlorosilane and silicon tetrachloride and then recycled.

Referring to FIG. 8, similarly to FIG. 7, the off-gas discharged from the chemical vapor deposition reactor is separated into a non-condensed gas phase stream containing hydrogen in an excessive amount and a condensed liquid phase stream containing chlorosilane-based compounds in an excessive amount in the first condensation and separation step (S10).

The non-condensed gas phase stream discharged from the first condensation and separation step (S10) is injected into the catalytic reaction step (S30) after the compression step (S20). At this time, hydrogen chloride contained in the non-condensed phase stream is converted into trichlorosilane and silicon tetrachloride in the catalytic reaction step (S30), thereby lowering the concentration of hydrogen chloride.

The non-condensed phase stream passed through the catalytic reaction step (S30) is sent to the second condensation and separation step (S40). Hydrogen discharged from the second condensation and separation step (S40) can be finally purified in the adsorption step (S50) and recycled. In addition, the condensed liquid phase stream having lowered concentration of hydrogen chloride, which is discharged from the second condensation and separation step (S40), can be sent to the first distillation step (S10) and recycled.

Separately, the condensed phase stream discharged from the first condensation and separation step (S10) can be sent to the distillation step (S60), separated into di-/richlorosilane and silicon tetrachloride and recycled.

Figure 9:
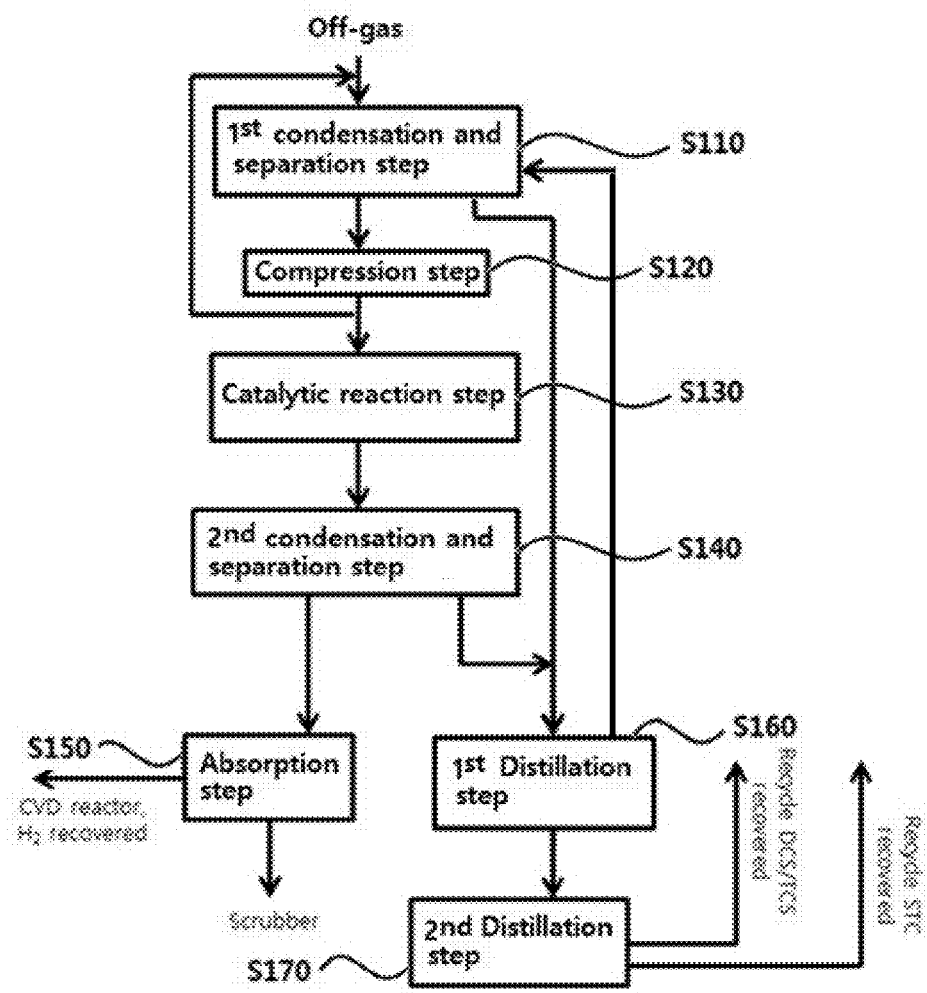
FIG. 9 illustrates a flow diagram of a purification method for off-gas in accordance with an embodiment of the present invention.
Figure 10:
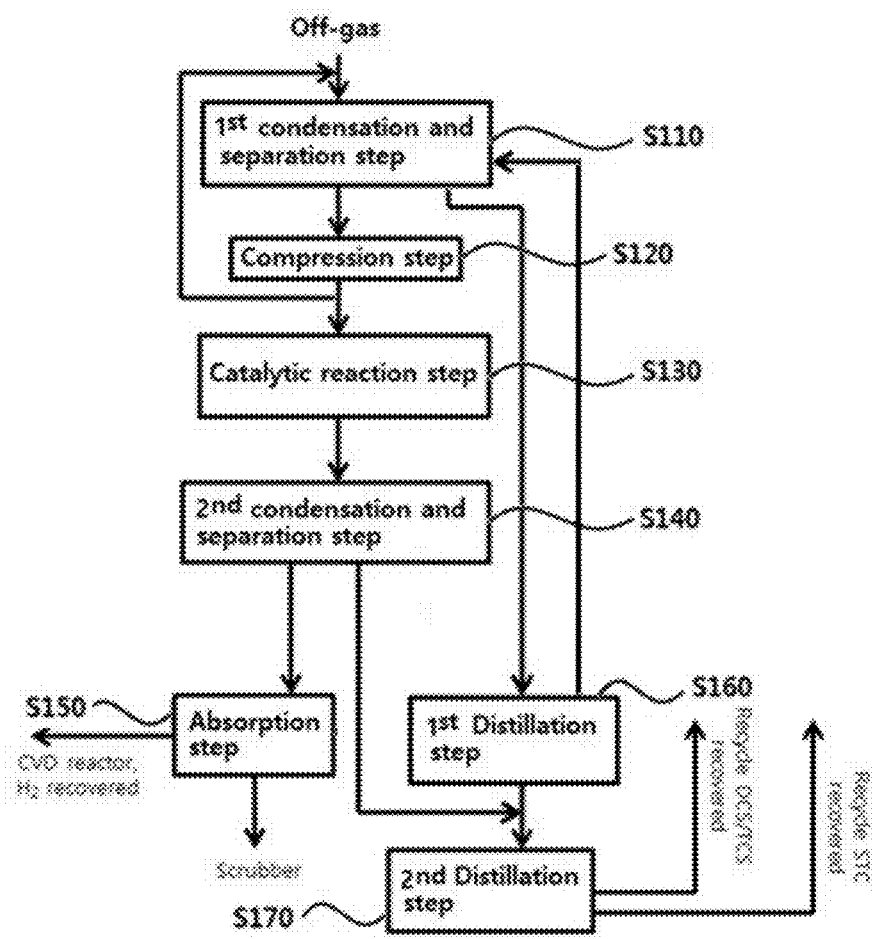
FIG. 10 illustrates a flow diagram of a purification method for off-gas in accordance with an embodiment of the present invention.
Figure 11:
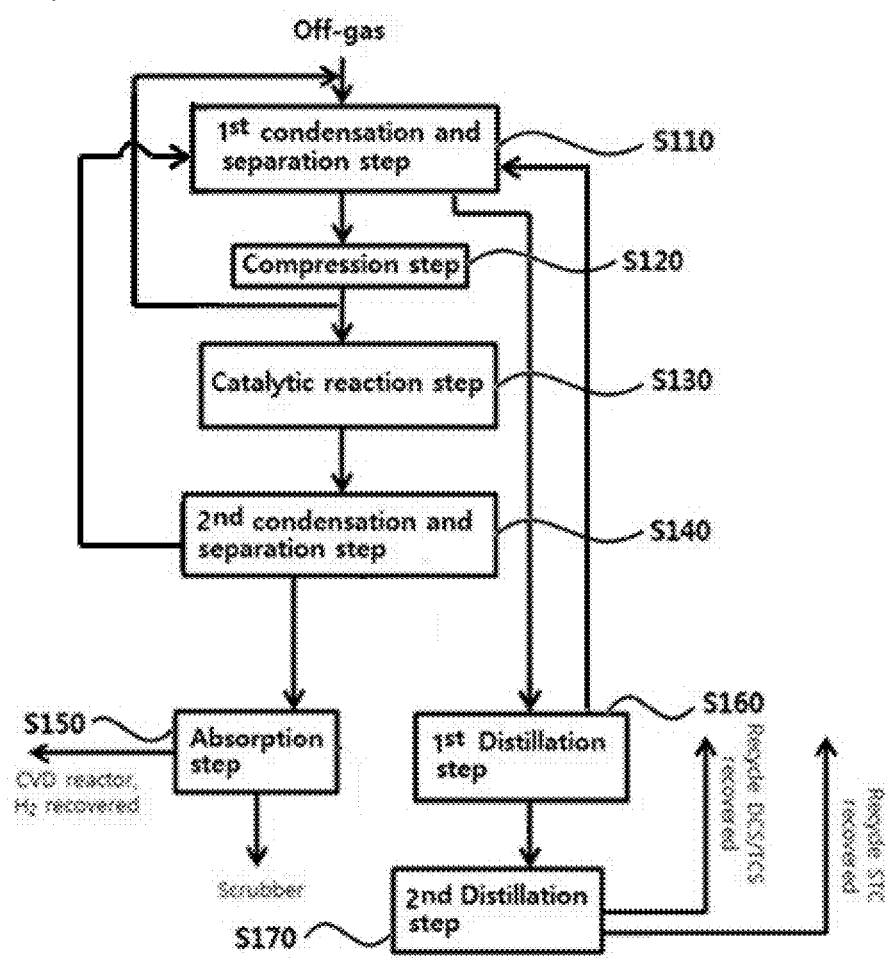
FIG. 11 illustrates a flow diagram of a purification method for off-gas in accordance with an embodiment of the present invention.

FIGS. 9 to 11 illustrate a flow diagram of a purification method for off-gas in accordance with an embodiment of the present invention.

Referring to FIGS. 9 to 11, the purification method for off-gas according to an embodiment of the present invention includes a first condensation and separation step (S110), a compression step (S120), a catalytic reaction step (S130), a second condensation and separation step (S140), an adsorption step (S150), a first distillation step (S160) and a second distillation step (S170).

First, referring to FIG. 9, the off-gas discharged from the chemical vapor deposition reactor is separated into a non-condensed gas phase stream containing hydrogen in an excessive amount and a condensed liquid phase stream containing chlorosilane-based compounds in an excessive amount in the first condensation and separation step (S110).

The non-condensed gas phase stream discharged from the first condensation and separation step (S110) is injected into the catalytic reaction step (S130) after the compression step (S120). At this time, hydrogen chloride contained in the non-condensed phase stream is converted into trichlorosilane and silicon tetrachloride in the catalytic reaction step (S130), thereby lowering the concentration of hydrogen chloride.

The non-condensed phase stream passed through the catalytic reaction step (S130) is sent to the second condensation and separation step (S140). Hydrogen discharged from the second condensation and separation step (S140) can be finally purified in the adsorption step (S150) and recycled. In addition, separately, hydrogen chloride contained in the non-condensed gas phase stream, which is discharged from the first condensation and separation step (S110), can be separated in the first distillation step (S160) and re-flowed into the first condensation and separation step (S110).

The condensed liquid phase stream having lowered concentration of hydrogen chloride, which is discharged from the second condensation and separation step (S140), can be joined with the condensed phase stream discharged from the first condensation and separation step (S110), and then injected into the first distillation step (S160). In the first distillation step (S160), a gas phase hydrogen chloride and a liquid phase chlorosilane-based stream are separated.

The chlorosilane-based stream discharged from the first distillation step (S160) can be sent to the second distillation step (S170), separated into di-/trichlorosilane and silicon tetrachloride and then recycled.

Referring to FIG. 10, similarly to FIG. 9, the off-gas discharged from the chemical vapor deposition reactor is separated into a non-condensed gas phase stream containing hydrogen in an excessive amount and a condensed liquid phase stream containing chlorosilane-based compounds in an excessive amount in the first condensation and separation step (S110).

The non-condensed gas phase stream discharged from the first condensation and separation step (S110) is injected into the catalytic reaction step (S130) after the compression step (S120). At this time, hydrogen chloride contained in the non-condensed phase stream is converted into trichlorosilane and silicon tetrachloride in the catalytic reaction step (S130), thereby lowering the concentration of hydrogen chloride.

The non-condensed phase stream passed through the catalytic reaction step (S1.30) is sent to the second condensation and separation step (S140). Hydrogen discharged from the second condensation and separation step (S140) can be finally purified in the adsorption step (S150) and recycled.

In addition, separately, hydrogen chloride contained in the non-condensed gas phase stream, which is discharged from the first condensation and separation step (S110), can be separated from chlorosilane-based streams in the first distillation step (S160) and re-flowed into the first condensation and separation step (S110).

The condensed liquid phase stream having lowered concentration of hydrogen chloride, which is discharged from the second condensation and separation step (S140), can be joined with the condensed phase stream discharged from the first condensation and separation step (S160) and then injected into the first distillation step (S170). In the first distillation step (S160), a gas phase hydrogen chloride and a liquid phase chlorosilane-based stream are separated.

The second stream be sent to the distillation step (S170) can be separated into di-/trichlorosilane and silicon tetrachloride and recycled.

Next, referring to FIG. 11, similarly to FIG. 9, the off-gas discharged from the chemical vapor deposition reactor is separated into a non-condensed gas phase stream containing hydrogen in an excessive amount and a condensed liquid phase stream containing chlorosilane-based compounds in an excessive amount in the first condensation and separation step (S110).

The non-condensed gas phase stream discharged from the first condensation and separation step (S110) is injected into the catalytic reaction step (S130) after the compression step (S120). At this time, hydrogen chloride contained in the non-condensed phase stream is converted into trichlorosilane and silicon tetrachloride in the catalytic reaction step (S130), thereby lowering the concentration of hydrogen chloride. The non-condensed phase stream passed through the catalytic reaction step (S130) is sent to the second condensation and separation step (S140). Hydrogen discharged from the second condensation and separation step (S140) can be finally purified in the adsorption step (S150) and recycled. In addition, separately, hydrogen chloride contained in the condensed gas phase stream, which is discharged from the first condensation and separation step (S110), can be separated from chlorosilane-based streams in the first distillation step (S160) and re-flowed into the first condensation and separation step (S110).

On the other hand, the condensed liquid phase stream having lowered concentration of hydrogen chloride, which is discharged from the second condensation and separation step (S140), can also be injected into the first condensation and separation step (S110) and cycled.

The condensed liquid phase stream having lowered concentration of hydrogen chloride, which is discharged from the first condensation and separation step (S10), can be sent to the first distillation step (S160) and separated into hydrogen chloride and chlorosilane-based streams. The chlorosilane-based stream discharged from the first distillation step (S160) is sent to the second distillation step (S170) and separated into di-/trichlorosilane and silicon tetrachloride and then recycled.

Figure 12:
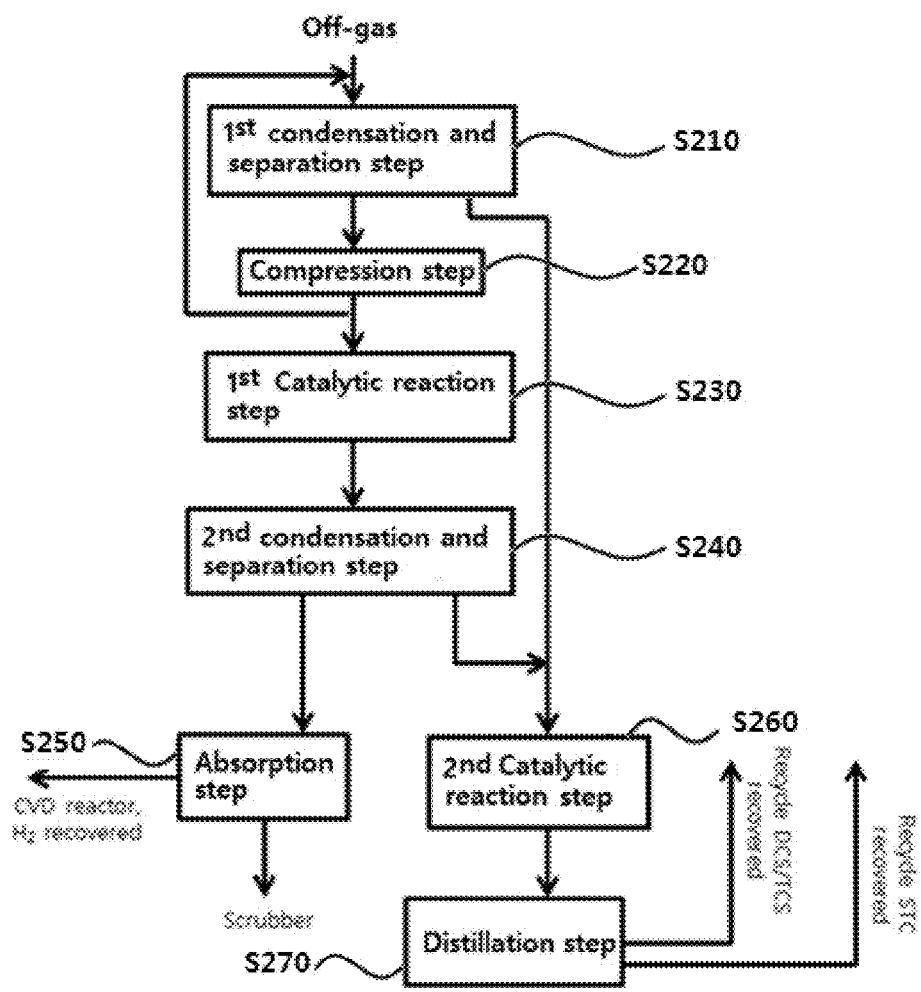
FIG. 12 illustrates a flow diagram of a purification method for off-gas in accordance with an embodiment of the present invention.
Figure 13:
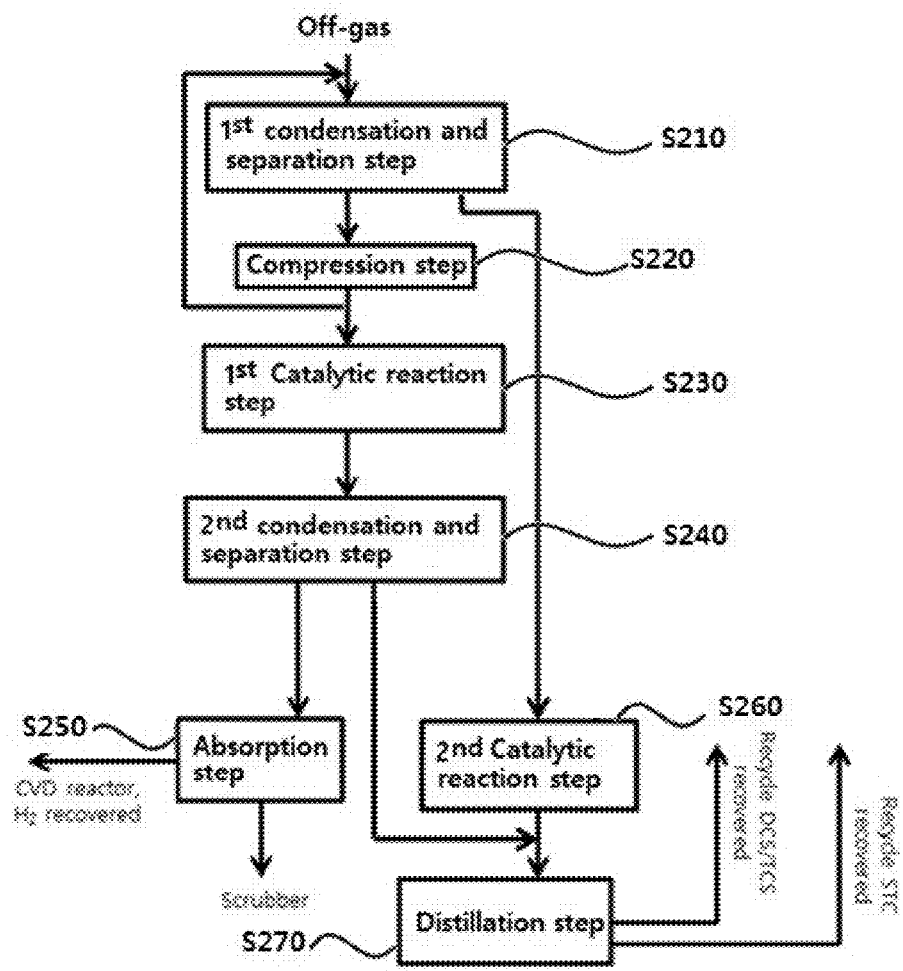
FIG. 13 illustrates a flow diagram of a purification method for off-gas in accordance with an embodiment of the present invention.
Figure 14:
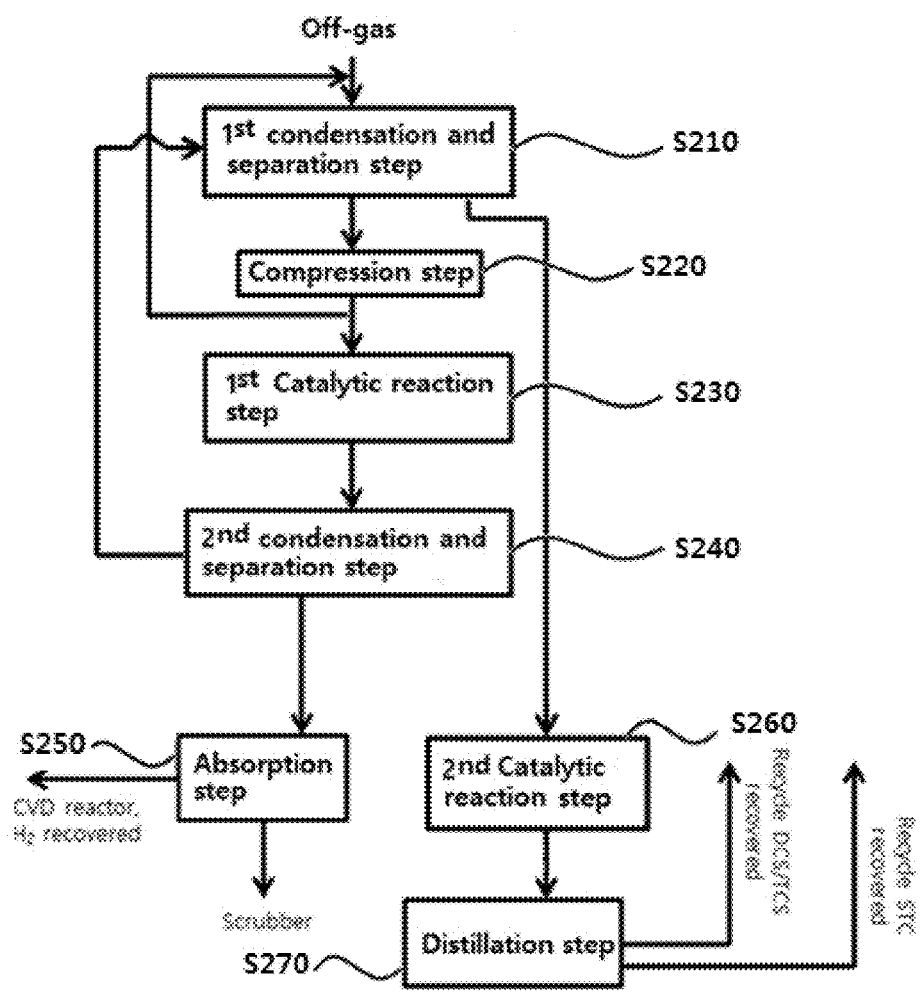
FIG. 14 illustrates a flow diagram of a purification method for off-gas in accordance with an embodiment of the present invention.

FIGS. 12 to 14 illustrate a flow diagram of a purification method for off-gas in accordance with an embodiment of the present invention.

Referring to FIGS. 12 to 14, the purification method for off-gas according to an embodiment of the present invention includes a first condensation and separation step (S210), a compression step (S220), a first catalytic reaction step (S230), a second condensation and separation step (S240), an adsorption step (S250), a second catalytic reaction step (S260), and a distillation step (S270).

First, referring to FIG. 12, the off-gas discharged from the chemical vapor deposition reactor is separated into a non-condensed gas phase stream containing hydrogen in an excessive amount and a condensed liquid phase stream containing chlorosilane-based compounds in an excessive amount in the first condensation and separation step (S210).

The non-condensed gas phase stream discharged from the first condensation and separation step (S210) is injected into the first catalytic reaction step (S230) after the compression step (S220). At this time, hydrogen chloride contained in the non-condensed phase stream is convened into trichlorosilane and silicon tetrachloride in the first catalytic reaction step (S230), thereby lowering the concentration of hydrogen chloride The non-condensed phase stream passed through the catalytic reaction step (S230) is sent to the second condensation and separation step (S240). Hydrogen discharged from the second condensation and separation step (S240) can be finally purified in the adsorption step (S250) and recycled.

In addition, separately, hydrogen chloride contained in the condensed phase stream, which is discharged from the first condensation and separation step (S210), can be converted into trichlorosilane and silicon tetrachloride in the first distillation step (S260), thereby lowering the concentration of hydrogen chloride.

The condensed liquid phase stream having lowered concentration of hydrogen chloride, which is discharged from the second condensation and separation step (S240), can be joined with the condensed phase stream discharged in the first condensation and separation step (S210), and then injected into the second catalytic reaction step (S260). In the second catalytic reaction step (S260), hydrogen chloride is converted into trichlorosilane and silicon tetrachloride as described above, and a chlorosilane-based stream is separated therefrom.

The chlorosilane-based stream discharged from the second catalytic reaction step (S260) can be sent to the distillation step (S270) and separated into di-/richlorosilane and silicon tetrachloride and recycled.

Referring to FIG. 13, similarly to FIG. 12, the off-gas discharged from the chemical vapor deposition reactor is separated into a non-condensed gas phase stream containing hydrogen in an excessive amount and a condensed liquid phase stream containing chlorosilane-based compounds in an excessive amount in the first condensation and separation step (S210).

The non-condensed gas phase stream discharged from the first condensation and separation step (S210) is injected into the first catalytic reaction step (S230) after the compression step (S220). At this time, hydrogen chloride contained in the non-condensed phase stream is converted into trichlorosilane and silicon tetrachloride in the catalytic reaction step (S230), thereby lowering the concentration of hydrogen chloride.

The non-condensed phase stream passed through the first catalytic reaction step (S230) is sent to the second condensation and separation step (S240). Hydrogen discharged from the second condensation and separation step (S240) can be finally purified in the adsorption step (S250) and recycled.

In addition, separately, hydrogen chloride contained in the non-condensed gas phase stream, which is discharged from the first condensation and separation step (S210), can be converted into trichlorosilane and silicon tetrachloride in the second catalytic reaction step (S260), thereby lowering the concentration of hydrogen chloride.

On the other hand, the condensed liquid phase stream having lowered concentration of hydrogen chloride, which is discharged from the second condensation and separation step (S240), can be joined with the condensed phase stream discharged from the second catalytic reaction step (S260) and then injected into the distillation step (S270).

The stream sent to the distillation step (S270) can be separated into di-/trichlorosilane and silicon tetrachloride and then recycled.

Next, referring to FIG. 14, similarly to FIG. 12, the off-gas discharged from the chemical vapor deposition reactor is separated into a non-condensed gas phase stream containing hydrogen in an excessive amount and a condensed liquid phase stream containing chlorosilane-based compounds in an excessive amount in the first condensation and separation step (S210).

The non-condensed gas phase stream discharged from the first condensation and separation step (S210) is injected into the first catalytic reaction step (S230) after the compression step (S220). At this time, hydrogen chloride contained in the non-condensed phase stream is converted into trichlorosilane and silicon tetrachloride in the first catalytic reaction step (S230), thereby lowering the concentration of hydrogen chloride.

The non-condensed phase stream passed through the catalytic reaction step (S230) is sent to the second condensation and separation step (S240). Hydrogen discharged from the second condensation and separation step (S240) can be finally purified in the adsorption step (S250) and recycled.

On the other hand, the condensed liquid phase stream having lowered concentration of hydrogen chloride, which is discharged from the second condensation and separation step (S240), can be again injected into the first condensation and separation step (S210) and then recycled.

In addition, separately, the condensed phase stream discharged from the first condensation and separation step (S210) is sent to the second catalytic reaction step (S260). At this time, hydrogen chloride contained in the condensed phase stream is converted into trichlorosilane and silicon tetrachloride in the second catalytic reaction step (S260), thereby lowering the concentration of hydrogen chloride. The chlorosilane-based stream having lowered concentration of hydrogen chloride, which is discharged from the second catalytic reaction step (S260), can be sent to the distillation step (S270), separated into di-/richlorosilane and silicon tetrachloride and then recycled.

The composition ratio of the respective components contained in the condensed phase or the non-condensed phase stream is not particularly limited, but according to an embodiment of the present invention, the non-condensed phase stream to be injected into the first catalytic reaction step may include about 0.01 to about 5 mol % of hydrogen chloride, about 80 to about 99 mol % of hydrogen, and the remaining amount of chlorosilane-based compound. On the other hand, for more effective removal of hydrogen chloride, the number of moles of the chlorosilane-based compound may include more than 1 mole relative to 1 mole of hydrogen chloride (HCl).

Step for passing the non-condensed phase in the first catalytic reaction step can be performed at a temperature of about −40 to about 40° C., preferably about −20 to about 300° C., more preferably from about 0 to about 200° C., under a pressure of about 1 to about 50 bar, preferably about 1 to about 40 bar, more preferably about 1 to about 30 bar, but are not limited thereto. The conditions can be appropriately changed as long as it is within the range where the catalyst used in the first catalytic reaction step is activated. On the other hand, according to the purification process for off-gas of the present invention, the first catalytic reaction step can be operated under conditions of temperature and pressure having much lower energy consumption than a conventional absorption column process for removing hydrogen chloride, thereby significantly reducing the energy consumption. Nevertheless, the removal efficiency of hydrogen chloride is equivalent to or greater than that of the absorption column process, thereby providing the effects of improving productivity and reducing the overall cost of the off-gas purification process.

According to one embodiment of the present invention, the condensed phase stream to be injected into the second catalytic reaction step may include about 0.01 to about 5 mol % of hydrogen chloride, about 0.01 to about 1 mol % of hydrogen, and a balance amount of a chlorosilane-based compound. On the other hand, for more effective removal of hydrogen chloride, the number of moles of the chlorosilane-based compound may include more than 1 mole relative to 1 mole of hydrogen chloride (HCl).

Step for passing the condensed phase stream through the second catalytic reaction step can be performed at a temperature of about −40 to about 400° C., preferably from about −20 to about 300° C., more preferably about 0 to about 200° C., under a pressure of about 1 to about 50 bar, about 1 to about 40 bar, more preferably about 1 to about 30 bar, but are not limited thereto. The conditions can be appropriately changed as long as they are within the range where the catalyst used in the second catalytic reaction step is activated.

The relative content of hydrogen chloride occupied in the entire condensed phase or non-condensed phase streams may be reduced to about 50 mol % or more, for example, about 50 to about 99.9 mol %, preferably about 80 to 99.9 mol %, more preferably about 90 to 100 mol %, with respect to the content before passing through the first and second catalytic reaction steps.

Hereinafter, the operation and effect of the present invention will be described in more detail with reference to specific examples of the invention. However, these examples are given for illustrative purposes only, and they are not intended to limit the scope of the present invention to those exemplified in the examples.

EXAMPLE

Preparation and Performance Evaluation of a Catalytic Reactor

Preparation Example 1

A catalytic reactor filled with an ion exchange resin catalyst was prepared, and the performance of the catalytic reactor was evaluated using a gas chromatography.

The stainless steel tubular reactor with outer diameter of ½ inch was filled with an amine functional group-containing styrene-divinylbenzene matrix type of ion exchange resin catalyst having a diameter of 490 to 690 μm (product name: Amberlyst® A-21). Through a separately connected line, the catalyst was flushed with ethanol of an amount equivalent to three times the catalyst bed volume for 1 hour and then again flushed with toluene of an amount equivalent to three times the catalyst bed volume for 1 hour to remove impurities and moisture contained the catalyst. Then, the catalyst was finally flushed with silicon tetrachloride of an amount equivalent to three times the catalyst bed volume to remove all residual solvent.

To a trichlorosilane solution obtained by dissolving hydrogen chloride in the catalytic reactor prepared as aforementioned, hydrogen was supplied into the reactor at a level of 100 cc per minute and bubbled in a trichlorosilane solution, thereby supplying in a gas state into the reactor. At this time, the temperature was maintained at 100° C., and the pressure was maintained at 2 bar so that trichlorosilane was not condensed. Then, the reaction residence time in the above conditions was about 10 seconds. The composition of the trichlorosilane gas evaporated by hydrogen was analyzed by gas chromatography through a by-pass line before the catalytic reaction, and it was confirmed that about 5 mol % of hydrogen chloride was contained compared to trichlorosilane.

After the reaction under the condition described above, the analysis results of the composition of gas are shown in Table 1 below.

Preparation Example 2

Trichlorosilane solution obtained by dissolving hydrogen chloride in the catalytic reactor of Preparation Example 1 was supplied into the reactor at a level of 10 ml per minute. The temperature was maintained at 50° C., and the pressure was maintained at 10 bar by pressurizing with hydrogen. The void volume of the catalyst bed was 65%, and the reaction residence time under the reaction condition was 13.5 seconds. The composition of the trichlorosilane solution where hydrogen chloride has been dissolved was analyzed through a by-pass line before the catalytic reaction, and it was confirmed that about 2 mol % of hydrogen chloride was contained compared to trichlorosilane.

After the reaction under the condition described above, the analysis results of the composition of gas are shown in Table 1 below.

Preparation Example 3

The off-gas purification effects of the catalytic reactor containing platinum (Pt) catalyst supported on an activated carbon were confirmed.

The catalytic reactor was prepared by using a stainless steel tube with a length of 50 cm and an outer diameter of ½ inch. 1.65 g of the activated carbon-based 0.5 wt % platinum catalyst was filled in this reactor, and then activated at 200° C. for 1 hour under flowing nitrogen. The catalyst used was a particle type (Alfa Aesar)

When the reaction gas was injected, trichlorosilane utilized a method of injecting hydrogen into a vessel containing trichlorosilane in a liquid state to perform vaporization, and anhydrous hydrogen chloride was added and mixed just before flowing into the reactor. Hydrogen was injected at about 100 cc/min, and hydrogen chloride was injected at about 30 cc/min. The molar ratio of hydrogen chloride and trichlorosilane was about 1:1.4.

The reactor temperature was set to 150° C. and the pressure was set to 1 bar. After the reaction under the condition described above, the analysis results of the composition of gas are shown in Table 1 below.

Preparation Example 4

The off-gas purification effects of the catalytic reactor containing an activated carbon were confirmed.

The catalytic reactor was prepared by using a stainless steel tube with a length of 50 cm and an outer diameter of ½ inch. 1.65 g of a particle type activated carbon (size of 2 mm or less, Alfa Aesar) was filled in this reactor. The activation was performed in the same manner as described in Preparation Example 3.

The reaction condition was set in the same manner as in Preparation Example 3. After the reaction under the condition described above, the analysis results of the composition of gas are shown in Table 1 below.

Preparation Example 5

The off-gas purification effect of the catalytic reactor containing platinum (Pt) catalyst supported on an activated carbon was confirmed.

The catalytic reactor was prepared by using a stainless steel tube with a length of 50 cm and an outer diameter of ½ inch. 1.6 g of the particle type activated carbon-based 0.5 wt % platinum catalyst (Alfa Aesar) was filled in this reactor. The activation was performed in the same manner as described in Preparation Example 3.

The reaction condition was set in the same manner as in Preparation Example 3. After the reaction under the condition described above, the analysis results of the composition of gas are shown in Table 1 below.

Preparation Example 6

The off-gas purification effects of the catalytic reactor containing platinum (Pt) catalyst supported on an activated carbon were confirmed.

The catalytic reactor was prepared by using a stainless steel tube with a length of 50 cm and an outer diameter of ½ inch. 1.6 g of the activated carbon-based 0.5 wt % platinum (PL) catalyst was filled in this reactor. The activation was performed in the same manner as described in Preparation Example 3.

The reaction condition was set to 80° C., and the remaining reaction gas injection and other reaction conditions were set in the same manner as in Preparation Example 3. After the reaction under the condition described above, the analysis results of the composition of gas are shown in Table 1 below.

Preparation Example 7

The reaction was performed in the same manner as in Preparation Example 6, except that 1.6 g of the particle type activated carbon-based 0.5 wt % palladium (Pd) catalyst was filled in this reactor and then used.

Preparation Example 8

The catalytic reactor and the activation were prepared in the same manner as in Preparation Example 6.

When the reaction gas was injected, trichlorosilane utilized a method of injecting hydrogen into a vessel containing trichlorosilane in a liquid state to perform vaporization, and anhydrous hydrogen chloride was added and mixed just before flowing into the reactor. Hydrogen was injected at about 200 cc/min, and hydrogen chloride was injected at about 15 cc/min. The molar ratio of hydrogen chloride and trichlorosilane was about 1:2.4.

The reactor temperature was set to 80° C. and the pressure was set to 1 bar. After the reaction under the condition described above, the analysis results of the composition of gas are shown in Table 1 below.

Preparation Example 9

The catalytic reactor and the activation were prepared in the same manner as in Preparation Example 7.

When the reaction gas was injected, trichlorosilane utilized a method of injecting hydrogen into a vessel containing trichlorosilane in a liquid state to perform vaporization, and anhydrous hydrogen chloride was added and mixed just before flowing into the reactor. Hydrogen was injected at about 200 cc/min, and hydrogen chloride was injected at about 15 cc/min. The molar ratio of hydrogen chloride and trichlorosilane was about 1:2.4.

The reactor temperature was set to 80° C. and the pressure was set to 1 bar. After the reaction under the condition described above, the analysis results of the composition of gas are shown in Table 1 below.

Preparation Example 10

The catalytic reactor and the activation were prepared in the same manner as in Preparation Example 4.

When the reaction gas was injected, trichlorosilane utilized a method of injecting hydrogen into a vessel containing trichlorosilane in a liquid state to perform vaporization, and anhydrous hydrogen chloride was added and mixed just before flowing into the reactor. Hydrogen was injected at about 200 cc/min, and hydrogen chloride was injected at about 15 cc/min. The molar ratio of hydrogen chloride and trichlorosilane was about 1:2.4.

The reactor temperature was set to 80° C. and the pressure was set to 1 bar. After the reaction under the condition described above, the analysis results of the composition of gas are shown in Table 1 below.

Preparation Example 11

The off-gas purification effects of the catalytic reactor containing platinum (Pt) catalyst supported on an activated carbon were confirmed.

The catalytic reactor was prepared by using a stainless steel tube with a length of 50 cm and an outer diameter of ½ inch. 1.6 g of the particle type activated carbon-based 2.0 wt % platinum (Pt) catalyst was filled in this reactor. The activation was performed in the same manner as described in Preparation Example 3.

When the reaction gas was injected, trichlorosilane utilized a method of injecting hydrogen into a vessel containing trichlorosilane in a liquid state to perform vaporization, and anhydrous hydrogen chloride was added and mixed just before flowing into the reactor. Hydrogen was injected at about 200 cc/min, and hydrogen chloride was injected at about 15 cc/min. The molar ratio of hydrogen chloride and trichlorosilane was about 1:2.4.

The reactor temperature was set to 80° C. and the pressure was set to 1 bar. After the reaction under the condition described above, the analysis results of the composition of gas are shown in Table 1 below.

Preparation Example 12

The catalytic reactor filled with an ion exchange resin catalyst was prepared, and the off-gas purification effects were confirmed.

The catalytic reactor was prepared by using a stainless steel tube with a length of 50 cm and an outer diameter of ½ inch. As the catalyst used in this reactor, 1.3 g of Amberlyst® A-21 (Dow chemical) was used as the ion exchange resin. Before filling in the reactor, the catalyst was impregnated with ethanol, washed with methyl chloride, and then dried and pre-treated for hours under blowing nitrogen.

When the reaction gas was injected, trichlorosilane utilized a method of injecting hydrogen into a vessel containing trichlorosilane in a liquid state to perform vaporization, and anhydrous hydrogen chloride was added and mixed just before flowing into the reactor. Hydrogen was injected at about 100 cc/min, and hydrogen chloride was injected at about 30 cc/min. The molar ratio of hydrogen chloride and trichlorosilane was about 1:1.4.

The reactor temperature was set to 80° C. and the pressure was set to 1 bar. After the reaction under the condition described above, the analysis results of the composition of gas are shown in Table 1 below.

Preparation Example 13

The catalytic reactor and the activation were prepared in the same manner as in Preparation Example 12.

When the reaction gas was injected, trichlorosilane utilized a method of injecting hydrogen into a vessel containing trichlorosilane in a liquid state to perform vaporization, and anhydrous hydrogen chloride was added and mixed just before flowing into the reactor. Hydrogen was injected at about 200 cc/min, and hydrogen chloride was injected at about 15 cc/min. The molar ratio of hydrogen chloride and trichlorosilane was about 1:2.4.

The reactor temperature was set to 80° C. and the pressure was set to 1 bar. After the reaction under the condition described above, the analysis results of the composition of gas are shown in Table 1 below.

Preparation Example 14

The catalytic reactor filled with an ion exchange resin catalyst was prepared, and the off-gas purification effects were confirmed.

The catalytic reactor was prepared by using a stainless steel tube with a length of 50 cm and an outer diameter of ½ inch. As the catalyst used in this reactor, 1.7 g of Reillex®HP (Vertellus Specialties) was filled and used as the ion exchange resin. Before filling in the reactor, the catalyst was impregnated with ethanol, washed with methyl chloride, and then dried and pre-treated for 20 hours under blowing nitrogen.

When the reaction gas was injected, trichlorosilane utilized a method of injecting hydrogen into a vessel containing trichlorosilane in a liquid state to perform vaporization, and anhydrous hydrogen chloride was added and mixed just before flowing into the reactor. Hydrogen was injected at about 200 cc/min, and hydrogen chloride was injected at about 15 cc/min. The molar ratio of hydrogen chloride and trichlorosilane was about 1:2.4.

The reactor temperature was set to 80° C. and the pressure was set to 1 bar. After the reaction under the condition described above, the analysis results of the composition of gas are shown in Table 1 below.

TABLE 1

| Preparation Example | Catalyst | Temperature | Molar composition ratio of reactants TCS/HCl | Composition ratio of discharged gas (unit: mol %) | | | | HCl decreasing rate |
|---|---|---|---|---|---|---|---|---|
| | | | | HCl | DCS | TCS | STC | |
| 1 | Amberlyst® A-21 | 100° C. | 20.0 | 0.1 | — | 94.7 | 5.2 | 98.1% |

TABLE 1-continued

| Preparation Example | Catalyst | Temperature | Molar composition ratio of reactants TCS/HCl | Composition ratio of discharged gas (unit: mol %) | | | | HCl decreasing rate |
|---|---|---|---|---|---|---|---|---|
| | | | | HCl | DCS | TCS | STC | |
| 2 | Amberlyst ® A-21 | 50° C. | 50.0 | — | 2 | 94 | 4 | 100% |
| 3 | Pt(0.5 wt %)/C | 150° C. | 1.4 | 0.7 | — | 28.2 | 71.1 | 99.0% |
| 4 | AC | 150° C. | 1.4 | 11.8 | 0.2 | 36.9 | 51.1 | 81.3% |
| 5 | Pd(0.5 wt %)/C | 150° C. | 1.4 | 0.6 | — | 29.0 | 70.5 | 99.2% |
| 6 | Pt(0.5 wt %)/C | 80° C. | 1.4 | 5.1 | — | 32.2 | 62.6 | 92.4% |
| 7 | Pd(0.5 wt %)/C | 80° C. | 1.4 | 4.3 | — | 31.6 | 64.0 | 93.7% |
| 8 | Pt(0.5 wt %)/C | 80° C. | 2.4 | 2.4 | — | 59.3 | 38.2 | 94.0% |
| 9 | Pd(0.5 t %)/C | 80° C. | 2.4 | 2.2 | — | 59.3 | 38.5 | 94.6% |
| 10 | AC | 80° C. | 2.4 | 12.6 | 0.2 | 63.5 | 23.7 | 65.2% |
| 11 | Pd(2.0 wt %)/C | 80° C. | 2.4 | 0.2 | — | 58.4 | 41.4 | 99.6% |
| 12 | Amberlyst ® A-21 | 80° C. | 1.4 | 14.1 | 0.4 | 38.5 | 47.0 | 76.9% |
| 13 | Amberlyst ® A-21 | 80° C. | 2.4 | 7.2 | 0.5 | 61.1 | 31.2 | 81.2% |
| 14 | Reillex ®HP | 80° C. | 2.4 | 7.1 | 0.3 | 61.1 | 31.5 | 81.6% |

Examples of Off-Gas Purification Process

Example 1

The off-gas was purified by using the purification apparatus shown in FIG. 2.

A catalytic reactor 3 filled with an ion exchange resin catalyst 4 was prepared according to Preparation Example 1.

The reaction temperature of the catalytic reactor 3 was set to 100° C., and the pressure was set to 5 bar. The composition of the off-gas flowing into the catalytic reactor 3 was 1 mol % of hydrogen chloride, 2 mol % of dichlorosilane, 10 mol % of trichlorosilane, 7 mol % of silicon tetrachloride and 80 mol % of hydrogen.

It was confirmed that the composition of the mixed gas 5 passed through the catalytic reactor 3 was 1 mol % of dichlorosilane, 11 mol % of trichlorosilane, 7 mol % of silicon tetrachloride and 81 mol % of hydrogen, all of which was removed by the reaction of hydrogen chloride with dichlorosilane under a predetermined reaction condition and converted into a higher chlorosilane such as trichlorosilane.

Example 2

The off-gas was purified by using the purification apparatus shown in FIG. 3.

A catalytic reactor 130 filled with an ion exchange resin catalyst 140 was prepared according to Preparation Example 1.

The reaction temperature of the catalytic reactor 130 was set to 100° C., and the pressure was set to 5 bar. The composition of the off-gas flowing into the catalytic reactor 130 was 1 mol % of hydrogen chloride, 2 mol % of dichlorosilane, 10 mol % of trichlorosilane, 7 mol % of silicon tetrachloride and 80 mol % of hydrogen.

The composition of the mixed gas 150 passed through the catalytic reactor 130 was 1 mol % of dichlorosilane, 11 mol % of trichlorosilane, 7 mol % of silicon tetrachloride and 81 mol % of hydrogen.

The purification temperature in the first distillation column 160 was set to have a distribution of −5 to −60° C., and the pressure was set to 23 bar.

As a result, the composition of the streams discharged from the top of the first distillation column 160 was 0.01 mol % of dichlorosilane, 0.03 mol % of trichlorosilane, 0.001 mol % of silicon tetrachloride and 99.96 mol % of hydrogen, and it was confirmed that streams consisting of high-purity hydrogen were discharged.

Example 3

The off-gas was purified by using the purification apparatus shown in FIG. 4.

A catalytic reactor 203 filled with an ion exchange resin catalyst 204 was prepared according to Preparation Example 1.

The reaction temperature of the catalytic reactor 203 was set to 100° C., and the pressure was set to 5 bar. The composition of the off-gas flowing into the catalytic reactor 203 was 1 mol % of hydrogen chloride, 2 mol % of dichlorosilane, 10 mol % of trichlorosilane, 7 mol % of silicon tetrachloride and 80 mol % of hydrogen.

The composition of the stream of the mixed gas 219, which was passed through the catalytic reactor 203 and then flowed into the separation membrane 220, was 1 mol % of dichlorosilane, 11 mol % of trichlorosilane, 7 mol % of silicon tetrachloride and 81 mol % of hydrogen.

The temperature in the knock-out drum 216 was set to have a −5° C., and the pressure was set at 3 bar.

As a result, the composition of the stream discharged from the separation membrane 220 was 0.01 mol % of dichlorosilane, 0.03 mol % of trichlorosilane, 0.001 mol % of silicon tetrachloride and 99.96 mol % of hydrogen, and it was confirmed that streams consisting of high-purity hydrogen were discharged.

Example 4

The off-gas was purified by using the purification apparatus shown in FIG. 5.

A catalytic reactor 550 filled with an ion exchange resin catalyst 555 was prepared according to Preparation Example 2.

The temperature in the knock-out drum 515 was set to have −5° C., and the pressure was set to 3 bar. The temperature of the catalytic reactor 550 was set to 50° C., and the pressure was set to 11 bar.

The composition of the condensed phase stream, which was passed through the knock-out drum 515 and then flowed into the reactor 550, was 2 mol % of hydrogen chloride, 9 mol % of dichlorosilane, 54 mol % of trichlorosilane, 34 mol % of silicon tetrachloride and 1 mol % of hydrogen.

As a result, the composition of the stream discharged from the reactor 550 was 2 mol % of dichlorosilane, 67 mol % of trichlorosilane, 29 mol % of silicon tetrachloride and 2 mol % of hydrogen, and it was confirmed that streams were discharged in a state where all hydrogen chloride has been removed.

Example 5

The off-gas was purified by using the purification apparatus shown in FIG. 6.

A catalytic reactor 250 filled with an ion exchange resin catalyst 655 was prepared according to Preparation Example 2.

The temperature in the knock-out drum 615 was set to have −5° C., and the pressure was set to 3 bar. The reaction temperature of the catalytic reactor 650 was set to 50° C., and the pressure was set to 11 bar. The non-condensed phase stream discharged from the top of the knock-out drum 615, flowed into the second cooler 620 and then cooled once more by a low-temperature cooling. The condensed stream was recycled to the knock-out drum 615. The low temperature cooling condition in a second cooler 620 was sent to −40° C. and the pressure was set to 23 bar.

The non-condensed phase stream, which was passed through the knockout drum 615 and the second cooler 620 and then flowed into the absorption column 625, showed that 66% of hydrogen chloride, 88% of dichlorosilane, 99% of trichlorosilane, and 97% of silicon tetrachloride were reduced compared to when not including a second cooler 620. Therefore, it was confirmed that the stream which was discharged from the bottom of the catalytic reactor 250 and recycled into the absorption column 625 was reduced by 56% and the effects of energy saving of about 10.3% were realized.

The composition of the condensed phase stream, which was passed through the knock-out drum 615 and then flowed into the reactor 650, was 2 mol % of hydrogen chloride, 9 mol % of dichlorosilane, 54 mol % of trichlorosilane, 34 mol % of silicon tetrachloride and 1 mol % of hydrogen.

As a result, the composition of the stream discharged from the reactor 650 was 2 mol % of dichlorosilane, 67 mol % of trichlorosilane, 29 mol % of silicon tetrachloride and 2 mol % of hydrogen, and it was confirmed that streams were discharged in a state where all hydrogen chloride has been removed.

Example 6

The off-gas was purified according to the process flow diagram shown in FIG. 7.

The temperature in the knock-out drum used in the first condensation and separation step was set to have −5° C., and the pressure was set to 3.4 bar. The temperature of the catalytic reactor used in the catalytic reaction step was set to 100° C., and the pressure was set to 23.85 bar. At this time, the catalytic reactor was prepared according to Preparation Example 1.

The composition of the non-condensed phase stream, which was passed through the knock-out drum and then flowed into the catalytic reactor, was 1.1 mol % of hydrogen chloride, 1.1 mol % of dichlorosilane, 2.9 mol % of trichlorosilane, 0.7 mol % of silicon tetrachloride and 94.2 mol % of hydrogen. The composition of the stream discharged from the catalytic reactor was 0.2 mol % of dichlorosilane, 3.6 mol % of trichlorosilane, 0.9 mol % of silicon tetrachloride and 95.3 mol % of hydrogen, and it was confirmed that streams were discharged in a state where all hydrogen chloride was removed.

The streams having lowered concentration of hydrogen chloride was condensed to −35° C. in the second condensation and separation step. At this time, the composition of the non-condensed phase was 0.2 mol % of trichlorosilane and 99.8 mol % of hydrogen, and it was confirmed that high purity hydrogen could be recovered through a subsequent adsorption column.

In addition, the condensed phase stream separated from the second condensation and separation step was joined with the condensed phase stream separated from the first condensation and separation step and injected into the distillation step for separating the silane-based compound. At this time, composition of the joined streams, which were injected into the distillation step, was 0.2 mol % of hydrogen chloride, 6.1 mol % of dichlorosilane, 58.7 mol % of trichlorosilane, and 35.0 mol % of silicon tetrachloride.

When performing the off-gas purification as described above, it could be confirmed that the effects of reducing the energy consumption by about 40%, compared with that according to the conventional process, were realized Example 7

The off-gas was purified according to the process flow diagram shown in FIG. 9.

The temperature in the knock-out drum used in the first condensation and separation step was set to have −5° C., and the pressure was set to 3.4 bar. The reaction temperature of the catalytic reactor used in the catalytic reaction step was set to 100° C., and the pressure was set to 23.85 bar. At this time, the catalytic reactor was prepared according to Preparation Example 1.

The composition of the non-condensed phase stream, which was passed through the knock-out drum and then flowed into the catalytic reactor, was 1.1 mol % of hydrogen chloride, 1.1 mol % of dichlorosilane, 2.9 mol % of trichlorosilane, 0.7 mol % of silicon tetrachloride and 94.2 mol % of hydrogen. The composition of the streams discharged from the catalytic reactor was 0.2 mol % of dichlorosilane, 3.6 mol % of trichlorosilane, 0.9 mol % of silicon tetrachloride and 95.3 mol % of hydrogen, and it was confirmed that streams were discharged in a state where all hydrogen chloride has been removed.

The streams having lowered concentration of hydrogen chloride was condensed to −35° C. in the second condensation and separation step. At this time, the composition of the non-condensed phase was 0.2 mol % of trichlorosilane and 99.8 mol % of hydrogen, and high purity hydrogen could be recovered through a subsequent adsorption step.

In addition, the condensed phase stream separated from the second condensation and separation step was joined with the condensed phase stream separated from the first condensation and separation step, and injected into the first distillation step for separating hydrogen chloride. At this time, the composition of the joined stream, which was injected into the distillation step, was 0.2 mol % of hydrogen chloride, 6.1 mol % of dichlorosilane, 58.7 mol % of trichlorosilane, and 35.0 mol % of silicon tetrachloride. The temperature in the distillation column used in the first distillation step was set to have a distribution of −35 to 150°

C. and the pressure was set to 12.3 bar. The streams of the chlorosilane-based compound separated in the first distillation step were injected into the second distillation step for separating the silane-based compound.

When performing the off-gas purification as described above, it could be confirmed that the effects of reducing the energy consumption by about 38%, compared with that according to the conventional process, were realized.

Example 8

The off-gas was purified according to the process flow diagram shown in FIG. 12.

The temperature in the knock-out drum used in the first condensation and separation step was set to −5° C., and the pressure was set to 3.4 bar. The reaction temperature of the first catalytic reactor used in the first catalytic reaction step was set to 100° C., and the pressure was set to 23.85 bar. At this time, the first catalytic reactor was prepared according to Preparation Example 1.

The composition of the non-condensed phase stream, which was passed through the knock-out drum and then flowed into the catalytic reactor, was 1.1 mol % of hydrogen chloride, 1.1 mol % of dichlorosilane, 29 mol % of trichlorosilane, 0.7 mol % of silicon tetrachloride and 94.2 mol % of hydrogen. The composition of the stream discharged from the catalytic reactor was 0.2 mol % of dichlorosilane, 3.6 mol % of trichlorosilane, 0.9 mol % of silicon tetrachloride and 95.3 mol % of hydrogen, and it was confirmed that streams were discharged in a state where all hydrogen chloride has been removed.

The streams having lowered concentration of hydrogen chloride was condensed to −35° C. in the second condensation and separation step. At this time, the composition of the non-condensed phase was 0.2 mol % of trichlorosilane and 99.8 mol % of hydrogen, and high-purity hydrogen could be recovered through a subsequent adsorption step.

In addition, the composition of the condensed phase stream separated from the second condensation and separation step was joined with the condensed phase stream discharged from the first condensation and separation step and injected into the second catalytic reactor to perform the second catalytic reaction step for removing hydrogen chloride. At this time, the composition of the streams, which were flowed into the second catalytic reactor, was 0.2 mol % of hydrogen chloride, 6.1 mol % of dichlorosilane, 58.7 mol % of trichlorosilane, and 35.0 mol % of silicon tetrachloride.

The reaction temperature in the second catalytic reactor was set to 50° C. and the pressure was set to 12.3 bar. The second catalytic reactor was prepared according to Preparation Example 2.

The composition of the streams discharged from the second catalytic reactor was 5.7 mol % of dichlorosilane, 58.3 mol % of trichlorosilane, and 36.0 mol % of silicon tetrachloride, and it was confirmed that streams were discharged in a state where all hydrogen chloride has been removed. The stream of the chlorosilane-based compound discharged from the second catalytic reactor was injected into the distillation step for separating the silane-based compound.

When performing the off-gas purification as described above, it could be confirmed that the effects of reducing the energy consumption by about 40%, compared with that according to the conventional process, were realized Example 9

The off-gas was purified according to the process flow diagram shown in FIG. 7.

The temperature in the knock-out drum used in the first condensation and separation step was set to −5° C., and the pressure was set to 3.4 bar. The reaction temperature of the catalytic reactor used in the catalytic reaction step was set to 150° C., and the pressure was set to 23.85 bar. At this time, the first catalytic reactor was prepared according to Preparation Example 3.

The composition of the non-condensed phase stream, which was passed through the knock-out drum and then flowed into the catalytic reactor, was 1.1 mol % of hydrogen chloride, 1.1 mol % of dichlorosilane, 2.9 mol % of trichlorosilane, 0.7 mol % of silicon tetrachloride and 94.2 mol % of hydrogen. The composition of the stream discharged from the catalytic reactor was 0.2 mol % of dichlorosilane, 3.6 mol % of trichlorosilane, 0.9 mol % of silicon tetrachloride and 95.3 mol % of hydrogen, and it was confirmed that streams were discharged in a state where all hydrogen chloride has been removed.

The stream having lowered concentration of hydrogen chloride was condensed to −35° C. in the second condensation and separation step. At this time, the composition of the non-condensed phase was 0.2 mol % of trichlorosilane and 99.8 mol % of hydrogen, and high-purity hydrogen could be recovered through a subsequent adsorption column.

In addition, the condensed phase stream separated from the second condensation and separation step was joined with the condensed phase stream separated from the first condensation and separation step and injected into the distillation step for separating a silane-based compound. At this time, the composition of the stream, which was flowed into the distillation step, was 0.2 mol % of hydrogen chloride, 6.1 mol % of dichlorosilane, 58.7 mol % of trichlorosilane, and 35.0 mol % of silicon tetrachloride.

When performing the off-gas purification as described above, it could be confirmed that the effects of reducing the energy consumption by about 30%, compared with that according to the conventional process, were realized Example 10

The off-gas was purified according to the process flow diagram shown in FIG. 8.

The temperature in the knock-out drum used in the first condensation and separation step was set to −5° C., and the pressure was set to 3.4 bar. The reaction temperature of the catalytic reactor used in the catalytic reaction step was set to 100° C., and the pressure was set to 23.85 bar. At this time, the catalytic reactor was prepared according to Preparation Example 1.

The composition of the non-condensed phase stream, which was passed through the knock-out drum and then flowed into the catalytic reactor, was 1.1 mol % of hydrogen chloride, 1.1 mol % of dichlorosilane, 29 mol % of trichlorosilane, 0.7 mol % of silicon tetrachloride and 94.2 mol % of hydrogen. The composition of the stream discharged from the catalytic reactor was 0.2 mol % of dichlorosilane, 3.6 mol % of trichlorosilane, 0.9 mol % of silicon tetrachloride and 95.3 mol % of hydrogen, and it was confirmed that streams were discharged in a state where all hydrogen chloride has been removed.

The stream having lowered concentration of hydrogen chloride was condensed to −35° C. in the second condensation and separation step. At this time, the composition of the non-condensed phase was 0.2 mol % of trichlorosilane and 99.8 mol % of hydrogen, and high-purity hydrogen could be recovered through a subsequent adsorption column. The chlorosilane-based stream separated from the second condensation and separation step contained 3.2 mol % of dichlorosilane, 76.4 mol % of trichlorosilane, and 20.4 mol % of silicon tetrachloride, and these streams were recycled to the knock-out drum in the first condensation and separation step.

On the other hand, the condensed phase stream separated from the first condensation and separation step was injected into the distillation step for separating a silane-based compound.

When performing the off-gas purification as described above, it could be confirmed that the effects of reducing the energy consumption by about 35%, compared with that according to the conventional process, were realized

Example 11

The off-gas was purified according to the process flow diagram shown in FIG. 9.

The temperature in the knock-out drum used in the first condensation and separation step was set to −5° C., and the pressure was set to 3.4 bar. The reaction temperature of the catalytic reactor used in the catalytic reaction step was set to 150° C., and the pressure was set to 12.0 bar. The catalytic reactor was prepared according to Preparation Example 3.

The composition of the non-condensed phase stream, which was passed through the knock-out drum and then flowed into the catalytic reactor, was 1.1 mol % of hydrogen chloride, 1.1 mol % of dichlorosilane, 2.9 mol % of trichlorosilane, 0.7 mol % of silicon tetrachloride and 94.2 mol % of hydrogen. The composition of the stream, which was discharged from the catalytic reactor, was 0.2 mol % of dichlorosilane, 3.6 mol % of trichlorosilane, 0.9 mol % of silicon tetrachloride and 95.3 mol % of hydrogen, and it was confirmed that streams were discharged in a state where all hydrogen chloride has been removed.

The stream having lowered concentration of hydrogen chloride was condensed to −35° C. in the second condensation and separation step. At this time, the composition of the non-condensed phase was 0.2 mol % of trichlorosilane and 99.8 mol % of hydrogen, and high-purity hydrogen could be recovered through a subsequent adsorption step.

In addition, the condensed phase stream separated from the second condensation and separation step was joined with the condensed phase stream separated from the first condensation and separation step and injected into the first distillation step for separating hydrogen chloride. At this time, the composition of the stream, which was flowed into the first distillation step, was 0.2 mol % of hydrogen chloride, 6.1 mol % of dichlorosilane, 58.7 mol % of trichlorosilane, and 35.0 mol % of silicon tetrachloride.

The temperature in the distillation column used in the first distillation step was set to have a distribution of −35 to 150° C. and the pressure was set to 12.3 bar. The stream of the chlorosilane-based compound separated in the first distillation step was injected into the second distillation step for separating the silane-based compound.

When performing the off-gas purification as described above, it could be confirmed that the effects of reducing the energy consumption by about 45%, compared with that according to the conventional process, were realized.

Example 12

The off-gas was purified according to the process flow diagram shown in FIG. 10.

The temperature in the knock-out drum used in the first condensation and separation step was set to −5° C., and the pressure was set to 3.4 bar. The reaction temperature of the catalytic reactor used in the catalytic reaction step was set to 100° C., and the pressure was set to 120 bar. The catalytic reactor was prepared according to Preparation Example 1.

The composition of the non-condensed phase stream, which was passed through the knock-out drum and then flowed into the catalytic reactor, was 1.1 mol % of hydrogen chloride, 1.1 mol % of dichlorosilane, 2.9 mol % of trichlorosilane, 0.7 mol % of silicon tetrachloride and 94.2 mol % of hydrogen. The composition of the stream discharged from the catalytic reactor was 0.2 mol % of dichlorosilane, 3.6 mol % of trichlorosilane, 0.9 mol % of silicon tetrachloride and 95.3 mol % of hydrogen, and it was confirmed that streams were discharged in a state where all hydrogen chloride has been removed.

The stream having lowered concentration of hydrogen chloride was condensed to −35° C. in the second condensation and separation step. At this time, the composition of the non-condensed phase was 0.2 mol % of trichlorosilane and 99.8 mol % of hydrogen, and high-purity hydrogen could be recovered through a subsequent adsorption step.

In addition, the condensed phase stream separated from the second condensation and separation step was joined with the stream of the chlorosilane-based compound separated from the first condensation and separation step below and then transferred to the second distillation step for separating the chlorosilane-based compound. At this time, the composition of the stream, which was flowed into the second distillation step, was 5.7 mol % of dichlorosilane, 58.3 mol % of trichlorosilane, and 36.0 mol % of silicon tetrachloride.

On the other hand, the condensed phase stream separated from the first condensation and separation step was transferred to the first distillation step. The temperature in the distillation column used in the first distillation step was set to have a distribution of −35 to 150° C. and the pressure was set to 12.3 bar. The stream of the chlorosilane-based compound separated in the first distillation step was injected into the second distillation step for separating the silane-based compound.

When performing the off-gas purification as described above, it could be confirmed that the effects of reducing the energy consumption by about 50%, compared with that according to the conventional process, were realized.

Example 13

The off-gas was purified according to the process flow diagram shown in FIG. 11.

The temperature in the knock-out drum used in the first condensation and separation step was set to −5° C., and the pressure was set to 3.4 bar. The reaction temperature of the catalytic reactor used in the catalytic reaction step was set to 80° C., and the pressure was set to 12.0 bar. The catalytic reactor was prepared according to Preparation Example 1.

The composition of the non-condensed phase stream, which was passed through the knock-out drum and then flowed into the catalytic reactor, was 1.1 mol % of hydrogen chloride, 1.1 mol % of dichlorosilane, 29 mol % of trichlorosilane, 0.7 mol % of silicon tetrachloride and 94.2 mol % of hydrogen. The composition of the stream discharged from the catalytic reactor was 0.2 mol % of dichlorosilane, 3.6 mol % of trichlorosilane, 0.9 mol % of silicon tetrachloride and 95.3 mol % of hydrogen, and it was confirmed that streams were discharged in a state where all hydrogen chloride has been removed.

The stream having lowered concentration of hydrogen chloride was condensed to −35° C. in the second condensation and separation step. At this time, the composition of the non-condensed phase was 0.2 mol % of trichlorosilane and 99.8 mol % of hydrogen, and high-purity hydrogen could be recovered through a subsequent adsorption step.

In addition, the composition of the condensed phase was 3.2 mol % of dichlorosilane, 76.4 mol % of trichlorosilane, and 20.4 mol % of silicon tetrachloride. These streams was recycled to the knock-out drum of the first condensation and separation step.

On the other hand, the condensed phase stream separated from the first condensation and separation step was transferred to the first distillation step. The temperature in the distillation column used in the first distillation step was set to have a distribution of −35 to 150° C. and the pressure was set to 12.3 bar. The stream of the chlorosilane-based compound separated in the first distillation step was injected into the second distillation step for separating the silane-based compound.

When performing the off-gas purification as described above, it could be confirmed that the effects of reducing the energy consumption by about 53%, compared with that according to the conventional process, were realized.

Example 14

The off-gas was purified according to the process flow diagram shown in FIG. 12.

The temperature in the knock-out drum used in the first condensation and separation step was set to −5° C., and the pressure was set to 3.4 bar. The reaction temperature of the catalytic reactor used in the catalytic reaction step was set to 150° C., and the pressure was set to 12.0 bar. The catalytic reactor was prepared according to Preparation Example 3.

The composition of the non-condensed phase stream, which was passed through the knock-out drum and then flowed into the catalytic reactor, was 1.1 mol % of hydrogen chloride, 1.1 mol % of dichlorosilane, 29 mol % of trichlorosilane, 0.7 mol % of silicon tetrachloride and 94.2 mol % of hydrogen. The composition of the stream discharged from the catalytic reactor was 0.2 mol % of dichlorosilane, 3.6 mol % of trichlorosilane, 0.9 mol % of silicon tetrachloride and 95.3 mol % of hydrogen, and it was confirmed that streams were discharged in a state where all hydrogen chloride has been removed.

The stream having lowered concentration of hydrogen chloride was condensed to −35° C. in the second condensation and separation step. At this time, the composition of the non-condensed phase was 0.2 mol % of trichlorosilane and 99.8 mol % of hydrogen, and high-purity hydrogen could be recovered through a subsequent adsorption step.

In addition, the condensed phase stream separated from the second condensation and separation step was joined with the condensed phase stream discharged from the first condensation and separation step, and injected into the second catalytic reactor to perform the second catalytic reaction step for removing hydrogen chloride. At this time, the composition of the stream flowed into the second catalytic reactor was 0.2 mol % of hydrogen chloride, 6.1 mol % of dichlorosilane, 58.7 mol % of trichlorosilane, and 35.0 mol % of silicon tetrachloride.

The reaction temperature in the second catalytic reactor was set to 50° C., and the pressure was set to 12.3 bar. The catalytic reactor was prepared according to Preparation Example 2.

The composition of the stream discharged from the second catalytic reactor was 5.7 mol % of dichlorosilane, 58.3 mol % of trichlorosilane, and 36.0 mol % of silicon tetrachloride, and it was confirmed that streams were discharged in a state where all hydrogen chloride has been removed. The stream of the chlorosilane-based compound separated in the second distillation step was injected into the distillation step for separating the silane-based compound.

When performing the off-gas purification as described above, it could be confirmed that the effects of reducing the energy consumption by about 47%, compared with that according to the conventional process, were realized.

Example 15

The off-gas was purified according to the process flow diagram shown in FIG. 13.

The temperature in the knock-out drum used in the first condensation and separation step was set to −5° C., and the pressure was set to 3.4 bar. The reaction temperature of the first catalytic reactor used in the first catalytic reaction step was set to 100° C., and the pressure was set to 12.0 bar. The first catalytic reactor was prepared according to Preparation Example 1.

The composition of the non-condensed phase stream, which was passed through the knock-out drum and then flowed into the first catalytic reactor, was 1.1 mol % of hydrogen chloride, 1.1 mol % of dichlorosilane, 2.9 mol % of trichlorosilane, 0.7 mol % of silicon tetrachloride and 94.2 mol % of hydrogen. The composition of the stream discharged from the catalytic reactor was 0.2 mol % of dichlorosilane, 3.6 mol % of trichlorosilane, 0.9 mol % of silicon tetrachloride and 95.3 mol % of hydrogen, and it was confirmed that streams were discharged in a state where all hydrogen chloride has been removed.

The stream having lowered concentration of hydrogen chloride was condensed to −35° C. in the second condensation and separation step. At this time, the composition of the non-condensed phase was 0.2 mol % of trichlorosilane and 99.8 mol % of hydrogen, and high-purity hydrogen could be recovered through a subsequent adsorption step.

In addition, the condensed phase stream separated from the second condensation and separation step was joined with the condensed phase stream discharged from the first condensation and separation step, and transferred to the distillation step for separating the silane-based compound.

On the other hand, the condensed phase stream separated from the first condensation and separation step was injected into the second catalytic reactor to perform the second catalytic reaction step for removing hydrogen chloride. At this time, the composition of the stream flowed into the second catalytic reactor was 0.2 mol % of hydrogen chloride, 6.1 mol % of dichlorosilane, 56.9 mol % of trichlorosilane, and 33.1 mol % of silicon tetrachloride.

The reaction temperature in the second catalytic reactor was set to 50° C., and the pressure was set to 12.3 bar. The catalytic reactor was prepared according to Preparation Example 2.

The composition of the stream discharged from the second catalytic reactor was 5.7 mol % of dichlorosilane, 58.3 mol % of trichlorosilane, and 36.0 mol % of silicon tetrachloride, and it was confirmed that streams were discharged in a state where all hydrogen chloride has been removed. The stream of the chlorosilane-based compound separated in the second distillation step was injected into the distillation step for separating the silane-based compound.

When performing the off-gas purification as described above, it could be confirmed that the effects of reducing the energy consumption by about 52%, compared with that according to the conventional process, were realized.

Example 16

The off-gas was purified according to the process flow diagram shown in FIG. 14.

The temperature in the knock-out drum used in the first condensation and separation step was set to −5° C., and the pressure was set to 3.4 bar. The reaction temperature of the first catalytic reactor used in the first catalytic reaction step was set to 80° C. and the pressure was set to 12.0 bar. The first catalytic reactor was prepared according to Preparation Example 1.

The composition of the non-condensed phase stream, which was passed through the knock-out drum and then flowed into the first catalytic reactor, was 1.1 mol % of hydrogen chloride, 1.1 mol % of dichlorosilane, 2.9 mol % of trichlorosilane, 0.7 mol % of silicon tetrachloride and 94.2 mol % of hydrogen. The composition of the stream discharged from the catalytic reactor was 0.2 mol % of dichlorosilane, 3.6 mol % of trichlorosilane, 0.9 mol % of silicon tetrachloride and 95.3 mol % of hydrogen, and it was confirmed that streams were discharged in a state where all hydrogen chloride has been removed.

The stream having lowered concentration of hydrogen chloride was condensed to −35° C. in the second condensation and separation step. At this time, the composition of the non-condensed phase was 0.2 mol % of trichlorosilane and 99.8 mol % of hydrogen, and high-purity hydrogen could be recovered through a subsequent adsorption step.

In addition, the composition of the condensed phase was 3.2 mol % of dichlorosilane, 76.4 mol % of trichlorosilane, and 20.4 mol % of silicon tetrachloride, and this stream was recycled to the knock-out drum used in the first condensation and separation step.

On the other hand, the condensed phase stream discharged from the first condensation and separation step was injected into the second catalytic reactor to perform the second catalytic reaction step for removing hydrogen chloride. At this time, the composition of the stream flowed into the second catalytic reactor was 0.2 mol % of hydrogen chloride, 6.1 mol % of dichlorosilane, 56.9 mol % of trichlorosilane, and 33.1 mol % of silicon tetrachloride.

The reaction temperature in the second catalytic reactor was set to 50° C., and the pressure was set to 12.3 bar. The catalytic reactor was prepared according to Preparation Example 2.

The composition of the stream discharged from the second catalytic reactor was 5.7 mol % of dichlorosilane, 58.3 mol % of trichlorosilane, and 36.0 mol % of silicon tetrachloride, and it was confirmed that streams were discharged in a state where all hydrogen chloride has been removed. The stream of the chlorosilane-based compound separated in the second distillation step was injected into the distillation step for separating the silane-based compound.

When performing the off-gas purification as described above, it could be confirmed that the effects of reducing the energy consumption by about 55%, compared with that according to the conventional process, were realized.

DESCRIPTION OF SYMBOLS

10, 100, 200, 300: purification apparatus for off-gas
3, 130, 203, 550, 650: catalytic reactor
6, 229: distillation column
160, 345: first distillation column
190, 360: second distillation column
216, 315, 515, 615: knock-out drum
S10, S110, S210: first condensation and separation step
S20, S120, S220: compression step
S30, S130: catalytic reaction step
S40, S140, S240: second condensation and separation step
S50, S150, S250: adsorption step
S60, S270: distillation step
S160: first distillation step
S170: second distillation step
S230: first catalytic reaction step
S260: second catalytic reaction step

What is claimed is:

1. A method of purifying an off-gas, the method comprising,
separating the off-gas, which is discharged after performing a polysilicon deposition process by a chemical vapor deposition (CVD) reaction, into a non-condensed phase stream and a condensed phase stream, wherein the off-gas is condensed to greater than −30° C. and less than 10° C. to separate into the non-condensed phase stream and the condensed phase stream;
passing the non-condensed phase stream through a first catalytic reactor to lower the concentration of hydrogen chloride; and
separating a chlorosilane-based compound of the condensed phase stream according to the boiling point.

2. The method of purifying an off-gas according to claim 1, wherein the first catalytic reactor includes one or more catalysts selected from the group consisting of an ion exchange resin and a transition metal.

3. The method of purifying an off-gas according to claim 2, wherein the ion exchange resin catalyst includes a cyclic amine compound, a styrene-based polymer containing an amine group, a styrene-divinyl benzene-based polymer containing an amine group, an acrylic polymer containing an amine group, or mixtures thereof.

4. The method of purifying an off-gas according to claim 1, wherein the off-gas includes hydrogen chloride (HCl), hydrogen ($H_2$), and chlorosilane-based compounds.

5. The method of purifying an off-gas according to claim 1, wherein the content of hydrogen chloride occupied in the non-condensed phase steam which has been passed through the catalytic reactor is reduced to about 80 mol % or more, with respect to the content before passing through the catalytic reactor.

6. The method of purifying an off-gas according to claim 1, wherein the non-condensed phase steam is converted into trichlorosilane and silicon tetrachloride by passing through the first catalytic reactor.

7. The method of purifying an off-gas according to claim 1, further comprising a step of separating the non-condensed phase stream passed through the first catalytic reactor into hydrogen stream and chlorosilane-based stream.

8. The method of purifying an off-gas according to claim 7, wherein the separated chlorosilane-based stream is joined with the condensed phase stream and transferred to a step of separating the chlorosilane-based compound of the condensed phase stream according to the boiling point.

9. The method of purifying an off-gas according to claim 1, further comprising a step of lowering the concentration of hydrogen chloride contained in the condensed phase stream, before performing a step of separating the chlorosilane-based compound of the condensed phase stream according to the boiling point.

10. The method of purifying an off-gas according to claim 9, wherein the step of lowering the concentration of hydrogen chloride contained in the condensed phase stream is performed by distilling the condensed phase stream or by passing through a second catalytic reactor.

11. The method of purifying an off-gas according to claim 10, wherein the first catalytic reactor includes one or more catalysts selected from the group consisting of an ion exchange resin and a transition metal.

* * * * *